(12) United States Patent
Low et al.

(10) Patent No.: US 12,446,158 B2
(45) Date of Patent: Oct. 14, 2025

(54) CIRCUIT MODULES WITH ENCAPSULANT-EMBEDDED LEADFRAME TERMINALS, AND METHODS OF FABRICATING SUCH CIRCUIT MODULES

(71) Applicant: NXP USA, Inc., Austin, TX (US)

(72) Inventors: Boon Yew Low, Subang Jaya (MY); Fui Yee Lim, Sunway SPK (MY); Fernando A. Santos, Chandler, AZ (US); Dominic (PohMeng) Koey, Shah Alam (MY)

(73) Assignee: NXP USA, INC., Austin, TX (US)

( * ) Notice: Subject to any disclaimer, the term of this patent is extended or adjusted under 35 U.S.C. 154(b) by 217 days.

(21) Appl. No.: 18/486,179

(22) Filed: Oct. 13, 2023

(65) Prior Publication Data
US 2025/0126716 A1   Apr. 17, 2025

(51) Int. Cl.
*H05K 3/28* (2006.01)
*H05K 1/02* (2006.01)
*H05K 1/18* (2006.01)

(52) U.S. Cl.
CPC ........... *H05K 1/181* (2013.01); *H05K 1/0209* (2013.01); *H05K 3/284* (2013.01); *H05K 2201/0311* (2013.01); *H05K 2201/09409* (2013.01); *H05K 2203/1305* (2013.01)

(58) Field of Classification Search
CPC ......... H05K 3/284; H05K 2201/09409; H05K 1/0209
See application file for complete search history.

(56) References Cited

U.S. PATENT DOCUMENTS

| | | | |
|---|---|---|---|
| 6,177,636 B1 | 1/2001 | Fjelstad | |
| 8,076,184 B1 * | 12/2011 | Camacho | H01L 25/16 438/106 |
| 8,241,956 B2 * | 8/2012 | Camacho | H01L 21/56 257/676 |
| 9,607,953 B1 | 3/2017 | Li et al. | |

(Continued)

OTHER PUBLICATIONS

David Maliniak: "DDR Memory Testing Using Interposers", EE Times, Oct. 16, 2014; 4 pages.

(Continued)

*Primary Examiner* — Sherman Ng
(74) *Attorney, Agent, or Firm* — Sherry W. Gourlay

(57) ABSTRACT

A circuit module includes a module substrate with a mounting surface, and a plurality of conductive features and electronic circuitry coupled to the mounting surface. Encapsulant material covers the electronic circuitry and the mounting surface, and an upper surface of the encapsulant material defined a first surface of the circuit module. A plurality of leadframe terminals, each separated from a non-planar leadframe unit, extend from the conductive features at the mounting surface through the encapsulant material toward the first surface of the circuit module. Each of the leadframe terminals is formed from an elongated planar conductive feature of a leadframe unit, and the plurality of leadframe terminals is electrically coupled to the electronic circuitry through the conductive features and the module substrate. Encapsulant divots may extend into the encapsulant material from the first surface of the circuit module, and proximal ends of the leadframe terminals terminate at the encapsulant divots.

16 Claims, 11 Drawing Sheets

(56) References Cited

U.S. PATENT DOCUMENTS

| | | | |
|---|---|---|---|
| 10,629,518 B2 | 4/2020 | Sanchez et al. | |
| 2008/0265412 A1 | 10/2008 | Hasegawa | |
| 2010/0133665 A1 | 6/2010 | Ha et al. | |
| 2011/0140259 A1 | 6/2011 | Cho et al. | |
| 2012/0061814 A1* | 3/2012 | Camacho | H01L 23/49811 257/676 |
| 2012/0061822 A1* | 3/2012 | Pagaila | H01L 24/16 257/737 |
| 2012/0286407 A1* | 11/2012 | Choi | H01L 21/4853 257/676 |
| 2014/0175657 A1* | 6/2014 | Oka | H01L 25/0657 257/773 |
| 2015/0001646 A1 | 1/2015 | Mueller et al. | |
| 2020/0111765 A1 | 4/2020 | Kim et al. | |
| 2020/0273781 A1 | 8/2020 | Scharf et al. | |
| 2020/0343151 A1 | 10/2020 | Nomura et al. | |
| 2022/0130768 A1 | 4/2022 | Wei et al. | |

OTHER PUBLICATIONS

NXP datasheet "Simplify IoT Design with SCM-i.MX6Dual/6Quad Modules" Jul. 17, 2017, 4 pages; downloaded from https://www.arrow.com/en/research-and-events/articles/simplify-iot-design-scm-imx-6dual-6quad-modules on Oct. 12, 2023.

Galkina, Nina; "60pcs TSSOP8 SSOP8 SOP8 To DIP8 Interposer Module PCB Board Adapter Plate"; downloaded from https://ninagalkina.blogspot.com/2019/08/60pcs-tssop8-ssop8-sop8-todip8.html on Nov. 16, 2020; 13 pages (Aug. 27, 2019).

Sanyu-USA; "Interposer"; retrieved from the Internet https://sanyu-usa.com/products/interposer/ ; 4 pages (Dec. 1, 2021).

Tong Hsing Electronics Industrial Ltd. "BVA (Bond Via Array) Technology for PoP Assembly"; Apr. 2022; 23 pages.

* cited by examiner

CIRCUIT MODULES WITH ENCAPSULANT-EMBEDDED LEADFRAME TERMINALS, AND METHODS OF FABRICATING SUCH CIRCUIT MODULES

TECHNICAL FIELD

Embodiments of the subject matter described herein relate generally to circuit modules and electronic systems that include circuit modules, and more particularly to circuit modules with embedded terminals and electronic systems that include such circuit modules.

BACKGROUND

Various types of electronic systems employ circuit modules that include a printed circuit board (PCB), circuitry coupled to a mounting surface of the PCB, and non-conductive encapsulant (e.g., plastic encapsulant) that defines the upper surface of the module and protects the circuitry from the environment (e.g., from oxidation and contaminants). Typically, the embedded circuitry is electrically coupled through the PCB to conductive pads on the bottom surface of the PCB. The embedded circuitry may be electrically coupled to external circuitry by connecting the bottom-side conductive pads of the circuit module to corresponding conductive pads on a mounting surface of a system substrate.

Some circuit modules are configured to be stacked with other circuit modules or packaged electronic devices in order to enable vertical, "package-on-package" systems. These systems are desirable, in some cases, in that they tend to require a smaller mounting footprint on a system substrate, when compared with systems in which all modules and circuitry are mounted directly on the system substrate in a side-by-side manner. Modules configured to be used in package-on-package systems may utilize top-side interconnects that extend from the mounting surface to the upper surface of the circuit module, in order to provide for external electrical connections to the embedded circuitry. Methods of forming conventional top-side interconnects in such modules tend to be costly and/or complicated. Further, equipment for forming such top-side interconnects often occupies significant space on the manufacturing floor.

Accordingly, what are needed are circuit modules with top-side interconnects which are relatively inexpensive to manufacture, and/or that is manufacturable using equipment that does not take up large amounts of manufacturing floorspace.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
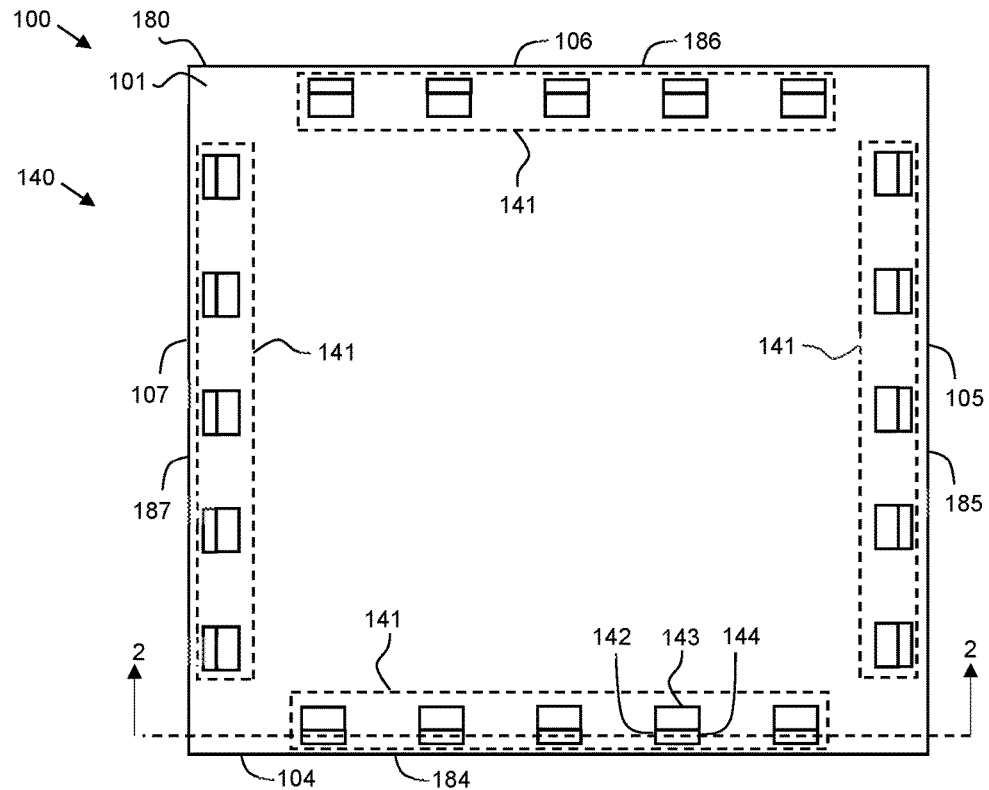
FIG. 1 is a top view of a circuit module that includes encapsulant-embedded leadframe terminals, according to an example embodiment.

Embodiments of the inventive subject matter described herein include a circuit module that includes a module substrate with a mounting surface, circuitry coupled to the mounting surface, encapsulant material covering the mounting surface and the circuitry, and conductive interconnects that extend from the mounting surface through the encapsulant material toward a first contact surface of the circuit module. An upper surface of the encapsulant defines the first contact surface of the circuit module.

According to one or more embodiments, each of the conductive interconnects is formed from an elongated planar conductive feature of a planar leadframe, and thus each interconnect may be referred to herein as a "leadframe interconnect." Each leadframe interconnect may have a rectangular cross-sectional area by virtue of the leadframe interconnect being formed from a portion of the planar leadfame. More specifically, each of the leadframe interconnects is formed from an elongated planar conductive feature that is attached at its proximal end to a leadframe flange feature. According to one or more embodiments, a leadframe divot may be formed in upper surface of the leadframe flange at the proximal end of each leadframe interconnect, and each leadframe interconnect may then be bent downward at its proximal end to extend at a right angle (i.e., orthogonally) from the leadframe flange, with the leadframe divot bending open during the bending process. This results in a leadframe unit, which includes the leadframe flange and a plurality of orthogonally-extending leadframe interconnects at up to four sides of the leadframe flange, with leadframe divots at the proximal ends of at least some of the leadframe interconnects.

To form a circuit module in accordance with one or more embodiments, electronic circuit components (e.g., integrated circuit dies, discrete surface mount components, wirebonds, and so on) are coupled to conductive features (e.g., bondpads) at a mounting surface of a module substrate. The leadframe unit is then aligned with the module substrate, and the distal ends of the leadframe interconnects are physically and electrically coupled to conductive features (e.g., additional bondpads) at the mounting surface of the module substrate. Encapsulant material (e.g., plastic encapsulant) is then applied over the electronic circuit components and around the leadframe interconnects, substantially filling the space between the mounting surface of the module substrate and the substrate-facing surface of the leadframe unit flange. According to one or more embodiments, the upper surface of the encapsulant material that contacts the substrate-facing surface of the leadframe unit flange corresponds to the first contact surface of the circuit module.

The concave upper surfaces of the leadframe divots remain unfilled with encapsulant during the process of applying the encapsulant material, and convex substrate-facing surfaces of the leadframe divots extend toward the substrate from the first contact surface. Accordingly, an unfilled, conductive leadframe divot is coupled to the proximal end of each leadframe interconnect. The leadframe flange is then removed. According to one or more embodiments, this results in the leadframe interconnects being retained in the encapsulant material and separated at their proximal ends from the leadframe divots and the leadframe flange. In such embodiments, the conductive material forming the leadframe divots is removed along with the leadframe flange, leaving proximal ends of the leadframe interconnects exposed in divots in the encapsulant material ("encapsulant divots"). In such embodiments, each encapsulant divot is defined by a concave surface of the encapsulant material, where the concave surface is recessed into the encapsulant material with respect to the first contact surface. In other embodiments, some or all of the conductive material forming the leadframe divots remains attached to the proximal ends of the leadframes interconnects, resulting in a plurality of recessed conductive leadframe divots that extend from the first contact surface of the encapsulant material toward the module substrate. To prepare the resulting electronic circuit module for attachment to a system substrate (e.g., in a flip-chip orientation) or to an overlying electronic device or module (e.g., in a package-on-package system), solder balls may be applied to the exposed proximal ends of the leadframe interconnects and/or to the recessed conductive leadframe divots.

According to one or more further embodiments, the circuit module may include an embedded conductive structure (e.g., a conductive coin, a set of thermal/ground vias, or another conductive feature) that extends through the module substrate, and an integrated circuit die (e.g., a power amplifier die) connected to a surface of the embedded heat dissipation structure that is exposed at the mounting surface of the module substrate. According to one or more specific embodiments, the integrated circuit die may include a power amplifier die, and the embedded conductive structure may provide a thermal path to an external heatsink. In addition or alternatively, the embedded conductive structure may provide a ground path for the power amplifier die.

In some embodiments, the circuit module may be coupled to a mounting surface of a system substrate in an inverted orientation (i.e., an orientation in which the contact surface of the encapsulant material contacts the system substrate, and the proximal ends of the leadframe terminals may be electrically coupled (e.g., through solder balls) to corresponding bondpads at the mounting surface of the system substrate). In such embodiments, the leadframe terminals may function as input/output (I/O) terminals, bias-conveying terminals, ground terminals, and so on. Further, a heatsink or other thermal dissipation structure may be coupled to an embedded conductive structure (if included) exposed at the upward-facing surface of the module substrate. This may be referred to herein as a "top-side cooled" electronic system.

Alternatively, the circuit module may be coupled to a system substrate in a non-inverted orientation (i.e., an orientation in which the module substrate contacts the system substrate), and the circuit module may serve as a "bottom" or "lower device" in a "package-on-package" electronic system. In such embodiments, bondpads exposed at the outer bottom surface of the module substrate may be electrically coupled to corresponding bondpads at the mounting surface of the system substrate, and the module bondpads may function as I/O terminals, bias-conveying terminals, ground terminals, and so on. In addition, bondpads of another circuit module or device (an "upper device," herein) may be electrically coupled (e.g., through solder balls) to the upward-facing, proximal ends of the leadframe interconnects (or the leadframe divots, if retained) to form a package-on-package electronic system. The leadframe interconnects may function as I/O terminals, bias-conveying terminals, ground terminals, and so on, between the circuit module and the upper device.

The circuit module embodiments described herein may be utilized to house any of a variety of different types of circuits. To provide a concrete example that will help to convey the details of the inventive subject matter, an example of a power amplifier module (and more specifically, a Doherty power amplifier) is utilized herein. However, those of skill in the art will understand, based on the description herein, that the inventive subject matter may be utilized in circuit modules other than power amplifier modules. Accordingly, the use of a power amplifier in the example embodiments below is not meant to limit application of the inventive subject matter only to power amplifier modules, as the inventive subject matter may be used in other types of electronic circuit modules, as well.

FIG. 1 is a top, external view of a circuit module 100 that includes encapsulant-embedded leadframe terminals 142, according to an example embodiment. To enhance understanding, FIG. 1 should be viewed simultaneously with FIG. 2, which is a cross-sectional, side view of the circuit module 100 of FIG. 1 along line 2-2. Circuit module 100 has first, second, third, and fourth sides 104, 105, 106, 107, which extend between first and second (or top and bottom) surfaces 101, 103 of the circuit module 100.

As will be described in detail below, circuit module 100 includes electronic circuitry implemented on or over a multi-layer module substrate 201. The electronic circuitry is embedded within encapsulant material 180. In addition, according to one or more embodiments, circuit module 100 includes one or more sets 141 of leadframe terminals 142 for providing electrical connectivity between the electronic circuitry and external circuitry (e.g., for conveying signals and bias voltages, and for connecting to ground references), as will be discussed in detail below. The electronic circuitry and the leadframe terminals 142 are embedded in encapsulant material 180, and proximal ends of the leadframe terminals 142 are exposed at the top surface 101 of the circuit module 100.

The module substrate 201 may include a multiple-layer printed circuit board (PCB) or other suitable substrate. The module substrate 201 has first, second, third, and fourth sides (only sides 205 and 207 are numbered) that extend between a first surface 202 (also referred to as a "top" or "mounting surface") and a second surface 203 (also referred to as a "bottom" or "heat sink attachment surface"). The bottom surface 203 of the module substrate 201 corresponds also to the bottom surface 103 of the circuit module 100.

More specifically, the module substrate 201 includes a plurality of dielectric layers 214, 215, 216 (e.g., formed from FR-4, ceramic, or other PCB dielectric materials), in an alternating arrangement with a plurality of conductive layers 209, 210, 211, 212, where the top surface 202 of the module substrate 201 is defined by a patterned conductive layer 212, and the bottom surface 203 of the module substrate 201 is defined by conductive layer 209. It should be noted that, although module substrate 201 is shown to include three dielectric layers 214-216 and four conductive layers 209-212, other embodiments of a module substrate may include more or fewer dielectric layers and/or conductive layers.

Each of the various conductive layers 209-212 may have a primary purpose, and also may include conductive features that facilitate signal and/or voltage/ground routing between other layers. Although the description below indicates a primary purpose for each of the conductive layers 209-212, it should be understood that the layers (or their functionality) may be arranged differently from the particular arrangement best illustrated in FIG. 2 and discussed below.

For example, in an embodiment, the patterned conductive layer 212 at the mounting surface 202 of the module substrate 201 may primarily function as a signal conducting layer. More specifically, layer 212 includes a plurality of conductive features (e.g., conductive pads and traces) which serve as attachment points for integrated circuit dies 234, 254, surface mount component 224, and other discrete components, and also provide electrical connectivity between the dies 234, 254, component 224, and the other discrete components.

In addition, as will be discussed below, layer 212 may include a plurality of conductive features 213 (e.g., bondpads) that are specifically designated for attachment of electrically conductive leadframe terminals 142 that are designed to convey signals, bias voltages, and/or ground connections. Layer 212 also may include a plurality of "dummy" pads to which "dummy" leadframe terminals 142 may be attached. As used herein, a "dummy" leadframe terminal is a terminal that is not assigned any particular function in the device, and is not coupled to any active circuitry. In various embodiments, the dummy terminals and dummy pads may be left electrically floating (i.e., not coupled to ground or other circuitry), or alternatively may be coupled to a ground layer (e.g., ground layer 211).

A second patterned conductive layer 211 functions as an RF ground layer, in an embodiment. The RF ground layer 211 also includes a plurality of conductive features (e.g., conductive traces), which may be electrically coupled to conductive features of the signal conducting layer 212 and to a system ground layer 209 (described below) with conductive vias (e.g., vias 217) that extend through the dielectric layers 214-216.

A third patterned conductive layer 210 functions to convey bias voltages to dies 234, 254, and also may function as a routing layer, as mentioned above. Finally, a fourth conductive layer 209 functions as a system ground layer and also as a heat sink attachment layer, as will be explained in more detail in conjunction with FIG. 21. In other embodiments, the fourth conductive layer 209 may be patterned, and conductive portions of the patterned conductive layer 209 may serve as input and output terminals, or other types of terminals, as will be explained in more detail in conjunction with FIG. 22.

Figure 2:
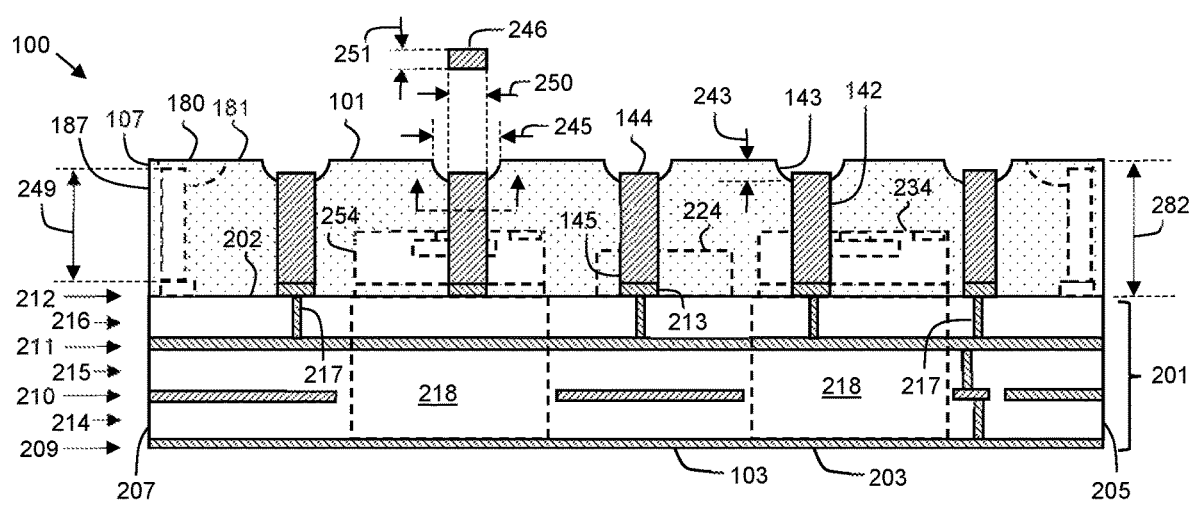
FIG. 2 is a side, cross-sectional view of the circuit module of FIG. 1 along line 2-2, according to an example embodiment.

According to an embodiment, module substrate 201 also includes one or more thermal dissipation structures 218, which extend through the module substrate 201 between the top and bottom surfaces 202, 203. The dies 234, 254 may be physically and electrically coupled to surfaces of the thermal dissipation structures 218 that are exposed at the top surface 202 of the module substrate 201. The bottom surfaces of the thermal dissipation structures 218 may be exposed at the bottom surface 203 of the module substrate 201, or the bottom surfaces of the thermal dissipation structures 218 may be covered with the bottom conductive layer 209, as shown in FIG. 2. Either way, during operation of the device 100, the thermal dissipation structures 218 are configured to provide thermal paths for heat produced by the dies 234, 254 between the top and bottom surfaces of the thermal dissipation structures 218. In various embodiments, the thermal dissipation structures 218 may include conductive metallic coins that are press-fit and/or attached into through-holes that extend between the surfaces 202, 203 of the module substrate 201. In alternate embodiments, each of the thermal dissipation structures 218 may include a plurality (or set) of conductive thermal vias (e.g., circular or bar vias) that extend between the surfaces 202, 203 of the module substrate 201. As will be described in more detail in conjunction with FIG. 21, the exposed bottom surfaces of the thermal dissipation structures 218 (or the portion of the conductive layer 209 overlying those surfaces) are physically and thermally coupled to a heat sink (e.g., heat sink 2116, FIG. 21) when the circuit module 100 is integrated within a top-side-cooled electrical system. Alternatively, as will be described in more detail in conjunction with FIG. 22, the exposed bottom surfaces of the thermal dissipation structures 218 (or the portion of the conductive layer 209 overlying those surfaces) may be physically and thermally coupled to conductive coins (e.g., conductive coins 2218, FIG. 22) when the circuit module 100 is integrated within a bottom-side-cooled or package-on-package electrical system.

As mentioned above, electronic circuitry is implemented on, over, and/or within the multi-layer module substrate 201. The electronic circuitry may include a plurality of dies and components coupled to the mounting surface 202 of the module substrate 201. For example, the circuitry may include at least one semiconductor die (e.g., dies 234, 254), at least one surface mount component (e.g., component 224), electrical interconnects (e.g., bondwires, bondpads, conductive vias, and conductive traces), and/or other electrical elements.

Non-conductive encapsulant material 180 (e.g., plastic encapsulant) is disposed on the mounting surface 202 and over and around the dies and components, and around the leadframe terminals 142. The encapsulant material 180 has first, second, third, and fourth sides 184, 185, 186, 187, which extend between the mounting surface 202 of the module substrate 201 and an exposed top surface 181 of the encapsulant material 180. The sides 184-187 of the encapsulant material 180 are co-planar with the sides (not numbered) of the module substrate 201 (and thus both the sides 184-187 of the encapsulant material 180 and the sides of the module substrate 201 are co-planar with the sides 104-107 of the circuit module 100). The top surface 181 of the encapsulant material 180 corresponds also to the top surface 101 of the circuit module 100. As shown in FIG. 2, the encapsulant material 180 has a thickness 282 that is greater than the maximum height of the components (e.g., surface mount component 220 and dies 234, 254) that are embedded within the encapsulant material 180.

The above-mentioned sets 141 of leadframe terminals 142 are embedded within the encapsulant material 180 proximate to the sides 184-187 of the encapsulant material 180 (and thus proximate to the sides 104-107 of the circuit module 100). The non-conductive encapsulant material 180 completely surrounds each of the leadframe terminals 142, except for their proximal ends, 144, which are exposed at surface 101 of the module 100. Accordingly, encapsulant material 180 is present between each leadframe terminal 142 and the nearest side 104-107 of the module 100. Each set 141 of leadframe terminals 142 may include one or more leadframe terminals 142. Although FIGS. 1-4 depict sets 141 that each include five leadframe terminals 142, each set 141 may include more or fewer leadframe terminals 142, and/or some sets 141 may be excluded from the circuit module 100. Further, in some embodiments, one or more leadframe terminals (not illustrated) may be located more centrally within the circuit module 100.

According to one or more embodiments, each leadframe terminal 142 includes an elongated planar conductive structure that extends from the mounting surface 202 of the module substrate 201 toward or to the top surface 101 of the circuit module 100. As shown in the cross-sectional view 246 in FIG. 2 above the leadframe terminal 142 that is second from the left side 107 of the circuit module 107, each leadframe terminal 142 may have a rectangular cross section defined by a leadframe terminal width 250 and a leadframe terminal thickness 251. For example, the leadframe terminal width 250 may be in a range of about 0.050 millimeters (mm) to about 0.100 mm, and the leadframe terminal thickness 251 may be in a range of about 0.050 mm to about 0.500 mm. In other embodiments, the leadframe terminal width 250 and/or the leadframe terminal thickness 250 may be smaller or larger than the above-given ranges. As will be described in detail below, the rectangular-shaped cross section 246 of each leadframe terminal 142 derives from the fact that each leadframe terminal 142 is formed from a portion of a substantially planar leadframe panel (e.g., leadframe panel 800, FIG. 8). The rectangular-shaped cross section of the leadframe terminal 142 represents a significant difference between circuit module 100 and conventional packaged devices.

According to one or more embodiments, a first end 144 of each leadframe terminal 142 (referred to as a "proximal end" herein) is exposed at the top surface 101 of the circuit module 100, and a second end 145 of each leadframe terminal 142 (referred to herein as a "distal end") is embedded within the encapsulant material 180. More particularly distal ends 145 of the terminals 142 are embedded within the encapsulant material 180, and are physically and electrically connected to conductive features 213 (e.g., bondpads) on the mounting surface 202 of the module substrate 201. The conductive features on the mounting surface 202 of the module substrate 201, in turn, are electrically coupled to the embedded circuitry. Accordingly, the leadframe terminals 142 are electrically coupled to the embedded circuitry.

A plurality of encapsulant divots 143 extend into the encapsulant material 180 at the top surface 101 of the circuit module 100, according to one or more embodiments, and the proximal ends 144 of leadframe terminals 142 are exposed in the encapsulant divots 143. Concave surfaces of the encapsulant divots 143 essentially are defined by the encapsulant material 180. Each of the encapsulant divots 143 have a width 245 that is greater than the leadframe terminal width 250 (e.g., between about 10 percent and about 200 percent wider than the leadframe terminal width 250). In addition, each of the encapsulant divots 143 have a lowest extent at a depth 243 below surface 101 in a range of at least about 0.100 mm to about 0.300 mm, although the depth 243 may be smaller or greater, as well.

In some embodiments, the thickness 282 of the encapsulant material 180 may be greater than the height 249 of the leadframe terminals 142, and thus the proximal ends 144 of the leadframe terminals 142 may be recessed below the top surface 101 of the circuit module 100. In other embodiments, the proximal ends 144 of the leadframe terminals 142 may extend to or above the top surface 101 of the circuit module 100.

Either way, the proximal ends 144 of the leadframe terminals 142 may be exposed within the encapsulant divots 143. In order physically and electrically to connect the proximal ends 144 of the leadframe terminals 142 to external circuitry, conductive attachment material may be applied to the proximal ends 144 of the leadframe terminals 142.

Figure 3:
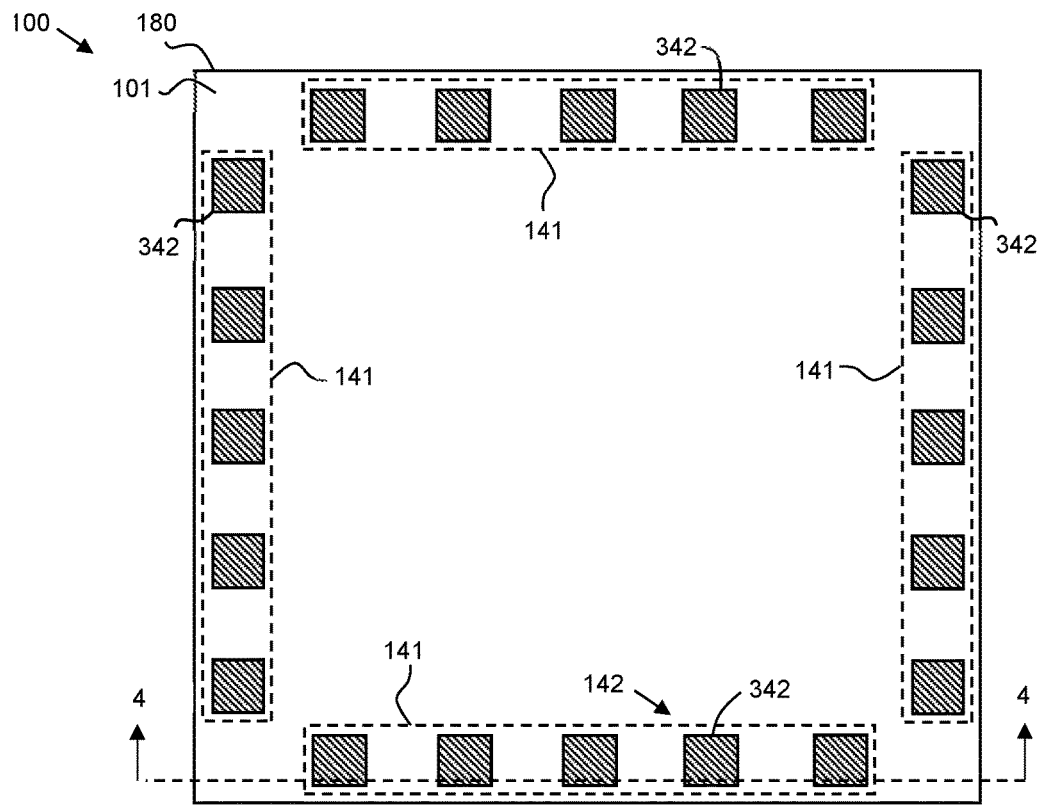
FIG. 3 is a top view of the circuit module of FIG. 1 with solder balls attached to proximal ends of the leadframe terminals, according to an example embodiment.
Figure 4:
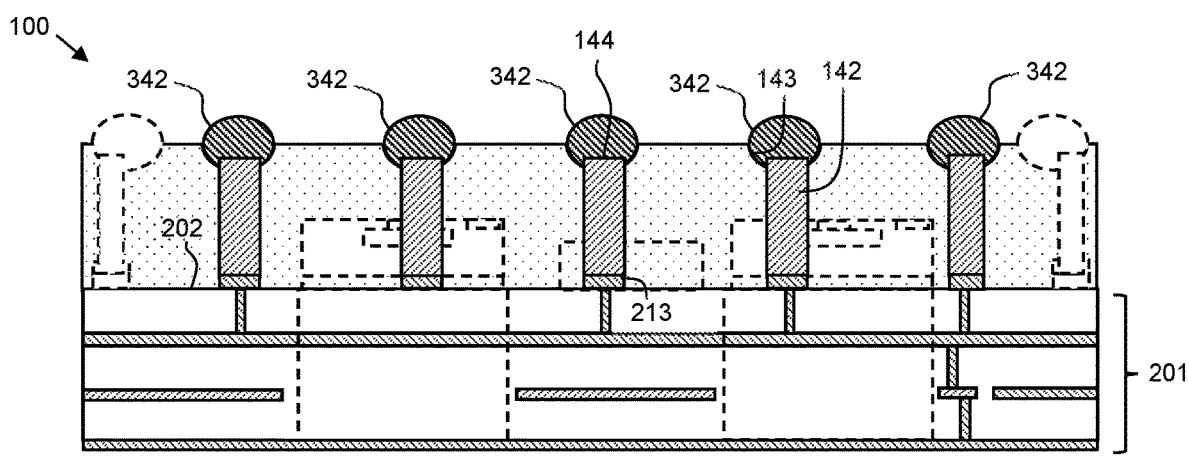
FIG. 4 is a side, cross-sectional view of the circuit module of FIG. 3 along line 4-4, according to an example embodiment.

To illustrate, FIGS. 3 and 4, respectively, illustrate a top view and a side, cross-sectional view (along line 4-4 of FIG. 3) of the circuit module 100 of FIG. 1 with conductive attachment material 342 deposited on and attached to the proximal ends 144 of the leadframe terminals 142 within divots 143, according to an example embodiment. For example, the conductive attachment material 342 may include solder balls, solder paste, or conductive adhesive. As will be explained in detail in conjunction with FIGS. 21 and 22, the conductive attachment material 342 enables the circuit module 100 to be connected, physically and electrically, to external circuitry in the form of a system substrate (e.g., substrate 2101, FIG. 21) or to another packaged electronic device (e.g., device 2210, FIG. 22).

As indicated previously, circuit module 100 may be utilized to house any of a variety of different types of circuits. To provide a concrete example that will help to convey the details of the inventive subject matter, an example of a power amplifier (and more specifically, a Doherty power amplifier) is utilized herein. However, those of skill in the art will understand, based on the description herein, that the inventive subject matter may be utilized in circuit modules with circuitry other than Doherty power amplifiers.

Figure 5:
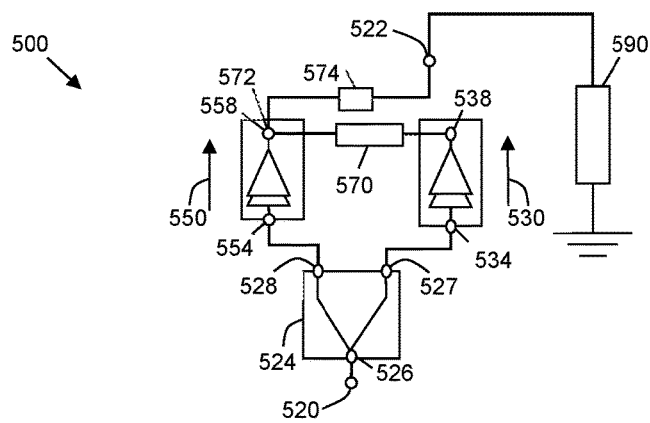
FIG. 5 is a schematic depiction of a Doherty power amplifier module.
Figure 6:
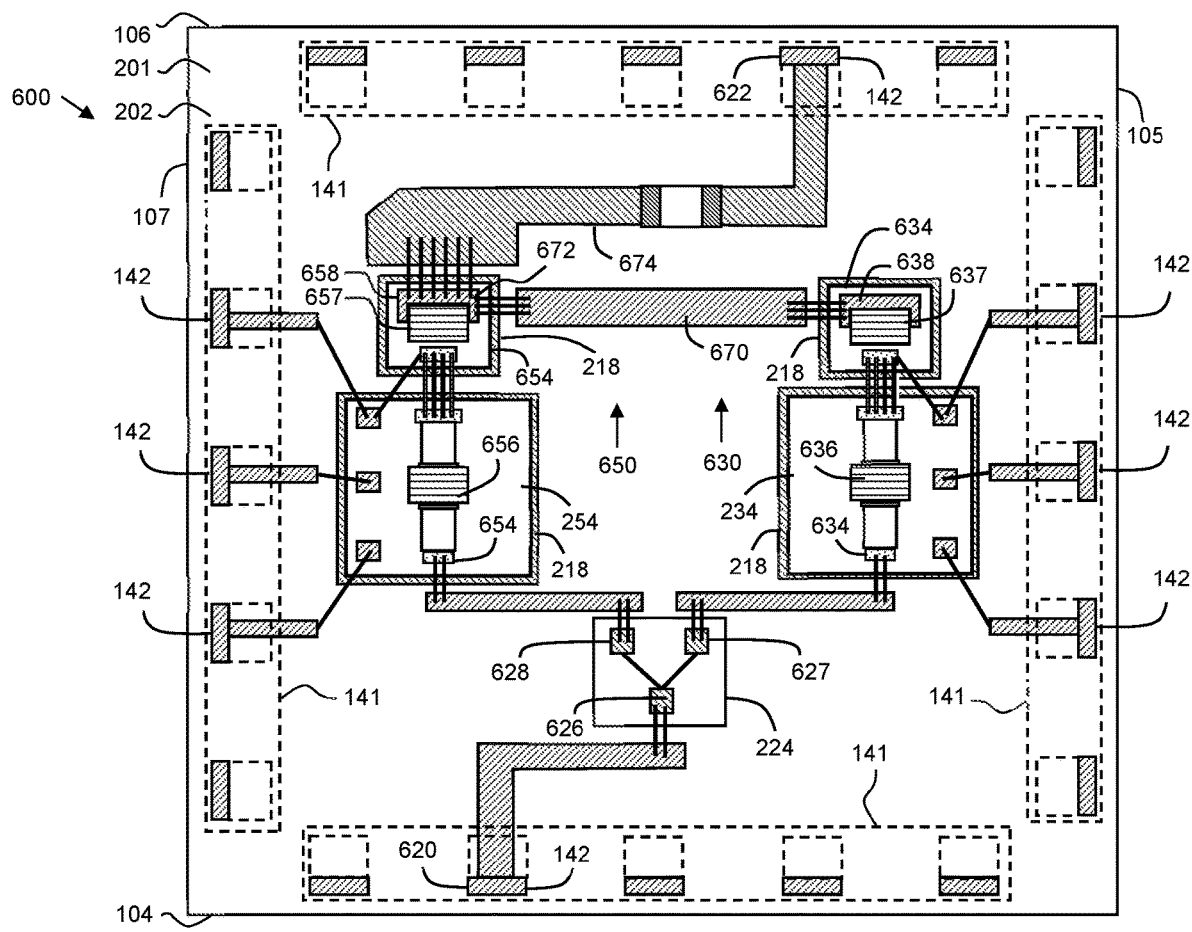
FIG. 6 is a top view, with encapsulant removed, of a power amplifier module that embodies the Doherty power amplifier of FIG. 5 and that includes encapsulant-embedded leadframe terminals, in accordance with an example embodiment.

FIG. 5 is a schematic depiction of a Doherty power amplifier 500. FIG. 5 should be viewed simultaneously with FIG. 6, which is a top view of a power amplifier module 600 that includes circuitry corresponding to the Doherty power amplifier 500 of FIG. 5, in accordance with an example embodiment. In FIG. 6, encapsulant material 180 (FIGS. 1-4) is not included to better show the circuitry of the power amplifier module 600. It should be understood that the encapsulant material 180 would be included in module 600, as discussed in conjunction with FIGS. 1-4.

Essentially, power amplifier module 600 includes various circuit components that correspond to the circuit elements of amplifier 500, as will be described below. It may be noted here that elements that have the same reference numbers between FIGS. 1-4 and 6 include substantially the same materials, functionality, and characteristics, and the details and embodiments of such elements that are described above in conjunction with FIGS. 1-4 apply also to the same-numbered elements in FIG. 6. Those details are incorporated into this description of FIG. 6.

The circuitry within power amplifier module 600 is supported by a multi-layer module substrate 201, which may be substantially the same as the embodiments of the module substrate 201 described in conjunction with FIG. 2. Briefly, module substrate 201 has a top surface 202 (or mounting surface 202), to which various dies (e.g., dies 234, 634, 254, 654, FIGS. 2, 4, 6) and surface mount components (e.g., components 224, FIGS. 2, 4, 6) are coupled. As indicated previously, the module substrate 201 also may include thermal dissipation structures 218, which extend between the mounting surface 202 and the bottom surface 203 (FIG. 2) of the module substrate 201. The dies 234, 634, 254, 654 may be physically and electrically coupled to surfaces of the thermal dissipation structures 218 that are exposed at the top surface 202 of the module substrate 201, and those surfaces of the thermal dissipation structures 218 may be considered to be coplanar portions of the top surface 202 of the module substrate 201.

In addition, a conductive layer (e.g., layer 212, FIG. 2) at the mounting surface 202 is patterned to include a plurality of conductive features (e.g., bondpads 213, 620, 622, FIGS. 2, 6) and conductive traces that electrically couple the mounting surface conductive features, dies, and surface mount components together. The surface mount component(s) (e.g., component 224, FIGS. 2, 4, 6) may be coupled to some of the conductive bondpads. In addition, as described above, a plurality of leadframe terminals 142 may be coupled to other ones of the conductive bondpads (e.g., to bondpads 620, 622, and the other unnumbered bondpads). According to some embodiments, the bondpads to which the leadframe terminals 142 are connected are located proximate to the sides 104-107 of the circuit module 600. Certain ones of the leadframe terminals 142 are configured to convey signals or bias voltages, while other ones of the leadframe terminals 142 may be configured to connect to ground references. Still other ones of the leadframe terminals 142 may be "dummy" terminals, which are electrically floating or coupled to ground.

The Doherty amplifier 500 and the power amplifier module 600 each include an RF input terminal 520, 620, an RF output terminal 522, 622, a power splitter 224, 524 (e.g., implemented as one or more surface mount components 224, FIGS. 2, 4, 6), a carrier amplifier path 530, 630 with one or more carrier amplifier dies (e.g., dies 234, 634, FIGS. 2, 6), a peaking amplifier path 550, 650 with one or more peaking amplifiers (e.g., dies 254, 654, FIGS. 2, 6), a phase delay and impedance inversion element 570, 670, and a combining node 572, 672, in an embodiment.

Each of the RF input terminal 520, 620 and RF output terminal 522, 622 may be implemented with an instance of a leadframe terminal (e.g., one of leadframe terminals 142, FIGS. 1-4, 6), in one or more embodiments. When incorporated into a larger RF system, the RF input terminal 520, 620 is coupled to an RF signal source, and the RF output terminal 522, 622 is coupled to a load 590 (e.g., an antenna or other load). The RF signal source provides an input RF signal, which is an analog signal that includes spectral energy that typically is centered around one or more carrier frequencies. Fundamentally, the Doherty amplifier 500 and the power amplifier module 600 are configured to amplify the input RF signal, and to produce an amplified RF signal at the RF output terminal 522, 622.

The power splitter 224, 524 has an input 526, 626 and two outputs 527, 627, 528, 628, in an embodiment. The power splitter input 526, 626 is coupled to the RF input terminal 520, 620 to receive the input RF signal. For example, in FIG. 6, the power splitter input 626 may be coupled to the RF input terminal 620 through a conductive trace of conductive layer 212 (FIG. 2) and one or more bondwires. The power splitter 224, 524 is configured to divide the RF input signal received at input 526, 626 into first and second RF signals (or carrier and peaking signals), which are provided to the carrier and peaking amplifier paths 530, 630, 550, 650 through outputs 527, 627, 528, 628, respectively. According to an embodiment, the power splitter 224, 524 includes a first phase shift element, which is configured to impart a first phase shift (e.g., about a 90 degree phase shift) to the peaking signal before it is provided to output 528, 628. Accordingly, at outputs 527, 627, and 528, 628, the carrier and peaking signals may be about 90 degrees out of phase from each other.

When the Doherty amplifier 500 implemented in power amplifier module 600 has a symmetrical configuration (i.e., a configuration in which the carrier and peaking amplifier power transistors are substantially identical in size), the power splitter 224, 524 may divide or split the input RF signal received at the input 526, 626 into two signals that are very similar with, in some embodiments, equal power. Conversely, when the Doherty amplifier 500 implemented in power amplifier module 600 has an asymmetrical configuration (i.e., a configuration in which one of the amplifier power transistors, typically the peaking amplifier transistor, is significantly larger), the power splitter 224, 524 may output carrier and peaking signals having unequal power.

The outputs 527, 627, 528, 628 of the power splitter 224, 524 are connected to the carrier and peaking amplifier paths 530, 630, 550, 650, respectively. The carrier amplifier path 530, 630 is configured to amplify the carrier signal from the power splitter 224, 524, and to provide the amplified carrier signal to the power combining node 572, 672. Similarly, the peaking amplifier path 550, 650 is configured to amplify the peaking signal from the power splitter 224, 524, and to provide the amplified peaking signal to the power combining node 572, 672, where the paths 530, 630, 550, 650 are designed so that the amplified carrier and peaking signals arrive in phase with each other at the power combining node 572, 672.

According to an embodiment, the carrier amplifier path 530, 630 includes one or more carrier amplifier dies (e.g., dies 234, 634, FIGS. 2, 6), and a phase shift and impedance inversion element 570, 670. More specifically, the carrier amplifier path 530, 630 includes an RF input terminal 534, 634, an RF output terminal 538, 638, and one or more amplification stages coupled between the input and output terminals 534, 634, 538, 638, in various embodiments. The RF input terminal 534, 634 is coupled to the first output 527, 627 of the power splitter 224, 524 (e.g., through bondwires and a conductive trace), and thus the RF input terminal 534, 634 receives the carrier signal produced by the power splitter 224, 524.

Each amplification stage of the carrier amplifier path 530, 630 includes a power transistor. In a single-stage carrier amplifier, a single power transistor (e.g., only transistor 636 or 637, FIG. 6) may be implemented on a single power amplifier die. In a two-stage carrier amplifier, two power transistors (e.g., both of transistors 636, 637, FIG. 6) may be implemented on a single power amplifier die, or each power amplifier may be implemented on a separate die (e.g., dies 234, 634, FIGS. 2, 6), as is illustrated in the power amplifier module depicted in FIG. 6.

Either way, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 534, 634, one of the current-carrying terminals (e.g., the drain terminal) is electrically connected to the RF output terminal 538, 638, and the other current-carrying terminal (e.g., the source terminal) is electrically connected to a ground reference (e.g., through a thermal dissipation structure 218). Conversely, a two-stage amplifier would include two power transistors coupled in series, where a first transistor functions as a driver amplifier transistor that has a relatively low gain, and a second transistor functions as a final-stage amplifier transistor that has a relatively high gain. In such an embodiment, the control terminal of the driver amplifier transistor is electrically connected to the RF input terminal 534, 634, one of the current-carrying terminals of the driver amplifier transistor (e.g., the drain terminal) may be electrically connected to the control terminal of the final-stage amplifier transistor, and the other current-carrying terminal of the driver amplifier transistor (e.g., the source terminal) is electrically connected to a ground reference. Additionally, one of the current-carrying terminals of the final-stage amplifier transistor (e.g., the drain terminal) is electrically connected to the RF output terminal 538, 638, and the other current-carrying terminal of the final-stage amplifier transistor (e.g., the source terminal) may be electrically connected to a ground reference.

In addition to the power transistor(s), portions of input and output impedance matching networks and bias circuitry (not illustrated in FIGS. 5, 6) also may be included within the carrier amplifier path 530, 630. Bias voltages for the transistors 636, 637 may be provided, for example, through multiple leadframe terminals (e.g., leadframe terminals 142 proximate to side 105, FIGS. 1, 6), in an embodiment. Further, in an embodiment in which the carrier amplifier path 530, 630 includes a two-stage amplifier, an interstage matching network (not illustrated in FIGS. 5, 6) also may be included along the carrier amplifier path 530, 630 between the driver and final-stage amplifier transistors (e.g., between transistors 636, 637, FIG. 6).

The RF output terminal 538, 638 of the carrier amplifier path 530, 630 is coupled to the power combining node 572, 672 through phase shift and impedance inversion element 570, 670, in an embodiment. According to an embodiment, the impedance inversion element may be implemented as a lambda/4 ($\lambda/4$) transmission line phase shift element (e.g., a microstrip line formed from conductive layer 212, FIG. 2), which imparts about a 90 degree relative phase shift to the carrier signal after amplification along the carrier amplifier path 530, 630. A first end of the impedance inversion element 570, 670 is coupled to the RF output terminal 538, 638 of the carrier amplifier path 530, 630 (e.g., through a set of wirebonds), and a second end of the phase shift element 570, 670 is coupled to the power combining node 572, 672 (e.g., through another set of wirebonds).

Reference is now made to the peaking amplifier path 550, 650, According to an embodiment, the peaking amplifier path 550, 650 includes one or more peaking amplifier dies (e.g., dies 254, 654, FIGS. 2, 6). More specifically, the peaking amplifier path 550, 650 includes an RF input terminal 554, 654, an RF output terminal 558, 658, and one or more amplification stages coupled between the input and output terminals 554, 654, 558, 658, in various embodiments. The RF input terminal 554, 654 is coupled to the second output 528, 628 of the power splitter 224, 524 (e.g., through bondwires and a conductive trace), and thus the RF input terminal 554, 654 receives the peaking signal produced by the power splitter 224, 524.

As with the carrier amplifier path 530, 630, each amplification stage of the peaking amplifier path 550, 650 includes a power transistor. In a single-stage peaking amplifier, a single power transistor (e.g., only transistor 656 or 657, FIG. 6) may be implemented on a single power amplifier die. In a two-stage peaking amplifier, two power transistors (e.g., both of transistors 656, 657, FIG. 6) may be implemented on a single power amplifier die, or each power amplifier may be implemented on a separate die (e.g., dies 254, 654, FIGS. 2, 6), as is illustrated in the power amplifier module depicted in FIG. 6.

Either way, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 554, 654, one of the current-carrying terminals (e.g., the drain terminal) is electrically connected to the RF output terminal 558, 658, and the other current-carrying terminal (e.g., the source terminal) is electrically connected to a ground reference (e.g., through a thermal dissipation structure 218). Conversely, a two-stage amplifier would include two power transistors coupled in series, where a first transistor functions as a driver amplifier transistor that has a relatively low gain, and a second transistor functions as a final-stage amplifier transistor that has a relatively high gain. In such an embodiment, the control terminal of the driver amplifier transistor is electrically connected to the RF input terminal 554, 654, one of the current-carrying terminals of the driver amplifier transistor (e.g., the drain terminal) may be electrically connected to the control terminal of the final-stage amplifier transistor, and the other current-carrying terminal of the driver amplifier transistor (e.g., the source terminal) is electrically connected to a ground reference. Additionally, one of the current-carrying terminals of the final-stage amplifier transistor (e.g., the drain terminal) is electrically connected to the RF output terminal 558, 658, and the other current-carrying terminal of the final-stage amplifier transistor (e.g., the source terminal) may be electrically connected to a ground reference.

In addition to the power transistor(s), portions of input and output impedance matching networks and bias circuitry (not illustrated in FIGS. 5, 6) also may be included within the peaking amplifier path 550, 650 and/or electrically coupled to the peaking amplifier. The bias voltages may be provided, for example, through multiple leadframe terminal (e.g., leadframe terminals 142 proximate to side 107, FIGS. 1, 6), in an embodiment. Further, in an embodiment in which the peaking amplifier path 550, 650 includes a two-stage amplifier, an interstage matching network (not illustrated in FIGS. 5, 6) also may be included along the peaking amplifier path 550, 650 between the driver and final-stage amplifier transistors (e.g., between transistors 656, 657, FIG. 6).

The RF output terminal 558, 658 of the peaking amplifier path 550, 650 is coupled directly to the power combining node 572, 672, in an embodiment. According to an embodiment, the RF output terminal 558, 658 of the peaking amplifier path 550, 650 and the combining node 572, 672 are implemented with a common element. More specifically, in an embodiment, the RF output terminal 558, 658 of the final stage transistor (e.g., transistor 657, FIG. 6) of the peaking amplifier path 550, 650 is configured to function both as the combining node 572, 672 and as the output terminal 558, 658 of the peaking amplifier path 550, 650. To facilitate combination of the amplified carrier and peaking signals, and as mentioned above, the RF output terminal 558, 658 (and thus the combining node 572, 672) is connected to the second end of the phase shift and impedance inversion element 570, 670 (e.g., through a set of wirebonds). In other embodiments, the combining node 572, 672 may be a separate element from the RF output terminal 558, 658.

Either way, the amplified carrier and peaking RF signals combine in phase at the combining node 572, 672. The combining node 572, 672 is electrically coupled to the RF output terminal 522, 622 to provide the amplified and combined RF output signal to the RF output terminal 522, 622. In an embodiment, an output impedance matching network 574, 674 between the combining node 572, 672 and the RF output terminal 522, 622 functions to present proper load impedances to each of the carrier and peaking amplifier paths 530, 630, 550, 650. The resulting amplified RF output signal is produced at RF output terminal 522, 622, to which an output load 590 (e.g., an antenna) is connected.

Doherty amplifier 500 and power amplifier module 600 are configured so that the carrier amplifier path 530, 630 provides amplification for relatively low level input signals, and both amplification paths 530, 630, 550, 650 operate in combination to provide amplification for relatively high level input signals. This may be accomplished, for example, by biasing the carrier amplifier transistors (e.g., transistors 636, 637, FIG. 6) so that the carrier amplifier transistors operate in a class AB mode, and biasing the peaking amplifier transistors (e.g., transistors 656, 657, FIG. 6) so that the peaking amplifier transistors operate in a class C mode.

In the embodiment illustrated in FIGS. 5 and 6 and described above, a first phase shift element in splitter 224, 524 imparts about 90 degrees of phase shift to the peaking signal prior to amplification, and phase shift and impedance inversion element 570, 670 similarly imparts about 90 degrees of phase shift to the amplified carrier signal so that the amplified carrier and peaking signals may combine in phase at the combining node 572, 672. Such an architecture is referred to as a non-inverted Doherty amplifier architecture. In an alternate embodiment, a first phase shift element in splitter 224, 524 may impart about 90 degrees of phase shift to the carrier signal prior to amplification, rather than to the peaking signal, a phase shift and impedance inversion element 570, 670 may be included instead at the output of the peaking amplifier, and the output terminal 538, 638 of the carrier amplifier path 530, 630 may function as the combining node. Such an alternate architecture is referred to as an inverted Doherty amplifier architecture. In still other alternate embodiments, other combinations of phase shift elements may be implemented in the carrier and/or peaking paths 530, 630, 550, 650 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 572, 672.

Methods of fabricating circuit modules 100, 600 will now be described. Embodiments of the method include first fabricating a non-planar "leadframe unit" (e.g., leadframe unit 820, FIG. 13), which will subsequently be attached to a module substrate (e.g., as described later in conjunction with FIGS. 14, 16).

Figure 7:
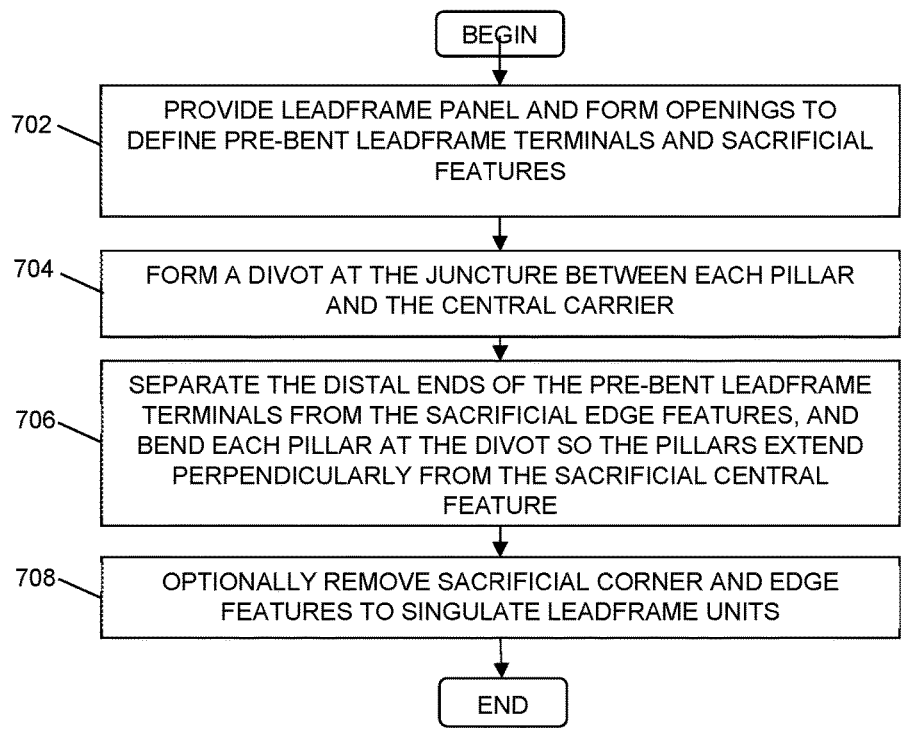
FIG. 7 is a flowchart of a method for fabricating a leadframe unit with leadframe terminals that are ready for attachment to a substrate of a circuit module, in accordance with an example embodiment.
Figure 8:
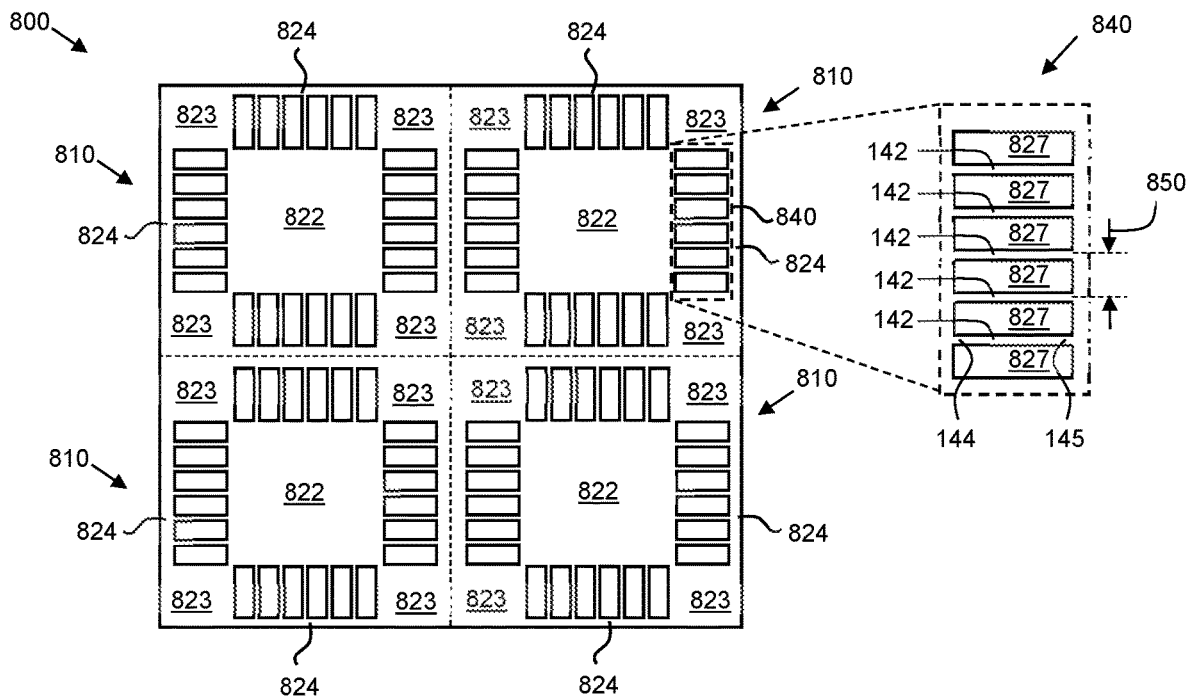
FIG. 8 is a top view of a leadframe panel with a plurality of leadframe units at a first stage of manufacture, in accordance with an example embodiment.

FIG. 7 is a flowchart of a method for fabricating one or more non-planar leadframe units 820 (FIGS. 11-13), each with a plurality of sets of leadframe terminals (e.g., terminals 142, FIGS. 1-4, 6, 8-13), in accordance with an example embodiment. For fabrication cost and efficiency, multiple identical non-planar leadframe units 820 (FIGS. 11-13) may be created in parallel in the context of a leadframe strip or leadframe panel, and the multiple non-planar leadframe units 820 may be separated from each other during the fabrication process. Alternatively, a non-planar leadframe unit 820 may be formed individually. To indicate both fabrication processes, FIG. 8 depicts a top view of a panel 800 used to fabricate an array of multiple non-planar leadframe units 820 in parallel, and FIGS. 9-13 each depict an individual planar or non-planar leadframe unit 810, 820 during a series of fabrication steps. It should be understood that panel 800 (FIG. 8) may instead be used to form only one non-planar leadframe unit 820, or that planar and non-planar leadframe units 810, 820 depicted in FIGS. 9-13 could be fabricated in the context of a panel.

Referring both to FIGS. 7 and 8, the method begins, in block 702, by providing a leadframe panel 800. For example, FIG. 8 is a top view of a leadframe panel 800 with four planar leadframe units 810 (delineated with dashed lines), in accordance with one or more embodiments.

The leadframe panel 800 may be a semi-rigid conductive (e.g., metal) sheet with substantially planar and parallel top and bottom surfaces. Accordingly, at this fabrication stage, each of the planar leadframe units 810 also has substantially planar and parallel top and bottom surfaces. The leadframe panel 800 may be formed from one or more conductive materials, including copper, copper alloys, and/or other suitable materials. According to an embodiment, the leadframe panel 800 may have a thickness 251 (FIG. 10) that corresponds, ultimately, to the thickness of each leadframe terminal (e.g., thickness 251 of terminal 142, FIG. 2).

As also indicated in block 702, the method further includes forming sets of openings 827 in each planar leadframe unit 810 of the leadframe panel 800 to define multiple pre-bent leadframe terminals 142 connected between the sacrificial central and edge features 822, 824. Essentially, each of the pre-bent leadframe terminals 142 corresponds to an elongated planar conductive feature of the planar leadframe unit 810. More specifically, As shown in FIG. 8, up to four sets of openings 827 may be formed adjacent to the four sides of each planar leadframe unit 810. According to other embodiments, fewer sets of openings 827 may be formed adjacent to fewer than all four sides of each planar leadframe unit 810. For enhanced understanding, an enlarged view of one of the sets 840 of openings 827 is shown on the right side of FIG. 8.

Forming openings 827 in the leadframe panel 800 may include performing an etching process, a stamping process, or another suitable process. According to an embodiment, and as best shown in the enlarged view of the set 840 of openings 827 on the right side of FIG. 8, each opening 827 is substantially rectangular in shape, and each set of adjacent openings 827 defines a pre-bent leadframe terminal 142 between the adjacent openings 827. The number of openings 827 is one greater than the number of per-bent leadframe terminals 142. The width (vertical dimension in FIG. 8) of each opening 142 defines the distance between adjacent leadframe terminals 142, and also defines the leadframe pitch 850 (i.e., the center-to-center distance between adjacent leadframe terminals 142). According to various embodiments, the leadframe pitch 850 is in a range of about 0.4 mm to about 0.1 mm, although the leadframe pitch 850 may be smaller or larger, as well. The length (horizontal dimension in FIG. 8) of each opening 142 defines the height (e.g., height 249, FIG. 2) of each pre-bent leadframe terminal 142. Finally, the separation distance between adjacent openings 827 defines the width (e.g., width 250, FIG. 2) of each pre-bent leadframe terminal 142.

Besides defining the pre-bent leadframe terminals 142, formation of the sets of openings 827 defines several other features of each planar leadframe unit 810. In particular, a sacrificial central feature 822 is defined between the sets of openings 827 within each planar leadframe unit 810. In addition, four sacrificial corner features 823 are defined between adjacent sets of openings 827. Finally, sacrificial edge features 824 are defined between the sets of openings 827 and the four edges of the planar leadframe unit 810. As can be best seen in the enlarged view of set 840 of openings 827 on the right side of FIG. 8, each pre-bend leadframe terminal 142 has a proximal end 144 connected to the sacrificial central feature 822, and a distal end 145 connected to one of the sacrificial edge features 824.

Figure 9:
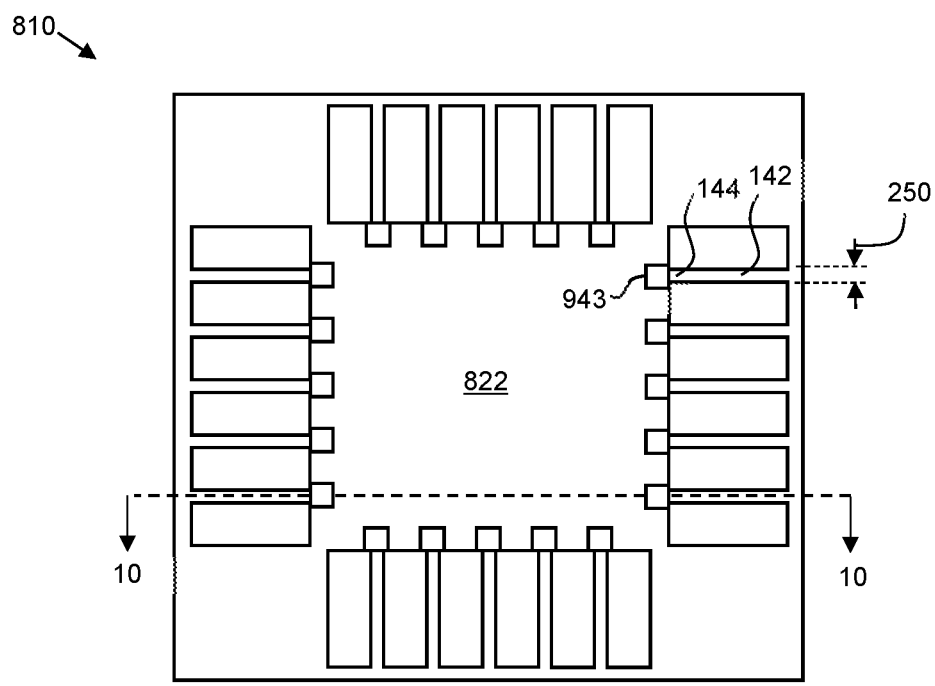
FIG. 9 is a top view of a leadframe unit of the leadframe panel at a second stage of manufacture, in accordance with an example embodiment.
Figure 10:
FIG. 10 is a side, cross-sectional view of the leadframe unit of FIG. 9 along line 10-10, in accordance with an example embodiment.

Referring now to FIGS. 7, 9, and 10, the method continues, in block 704, by forming a leadframe divot 943 in the planar upper surface 825 of the central sacrificial feature 822 next to a proximal end 144 of each pre-bent leadframe terminal 142. To illustrate, FIGS. 9 and 10 are, respectively, a top view and a side, cross-sectional view (along line 10-10) of one of the planar leadframe units 810 of FIG. 8 with leadframe divots 943, in accordance with one or more embodiments.

Each leadframe divot 943 is defined by a concave surface of the sacrificial central feature 822, which extends below the upper surface 825 of the sacrificial central feature 822. The leadframe divots 943 may be formed by performing a stamping process, a drilling process, or another suitable process. The shape of each divot 943 depends on the shape of the object used to form the divot 943. For example, when a stamping process is used, the shape of each divot 943 in the planar upper surface 825 may be square (as shown in FIG. 9), rectangular, circular or otherwise shaped, based on the shape of the stamp. Similarly, the cross-sectional shape of each divot 943 may be curved (as shown in FIG. 10), square, or rectangular or otherwise shaped, based on the shape of the stamp. According to one or more embodiments, each leadframe divot 943 may have a depth 944 below the upper surface 825 of the sacrificial central feature 822 (or the leadframe panel 800), with the depth 944 being in a range of about 40 percent to about 80 percent of the thickness 251 of the planar leadframe unit 810 (and the sacrificial central feature 822), although the depth 944 may be smaller or larger, as well. In addition, each leadframe divot 943 may have a width 945 in a range of about 110 percent to 300 percent or more of the width 250 of a pre-bent leadframe terminal 142. Alternatively, each leadframe divot 943 may be shallower, deeper, narrower or wider than the above-given ranges.

Figure 11:
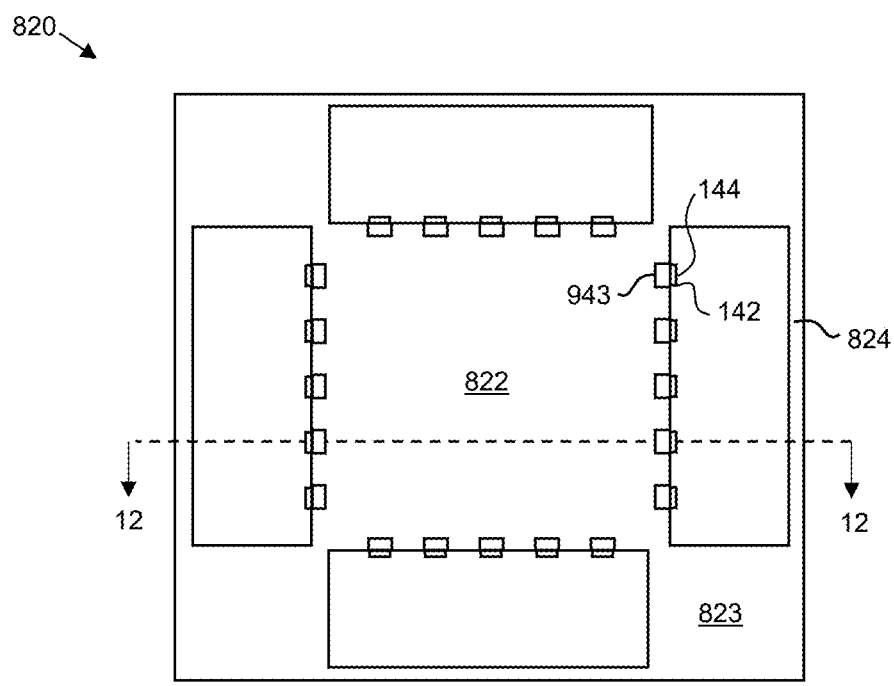
FIG. 11 is a top view of the leadframe unit at a third stage of manufacture, in accordance with an example embodiment.
Figure 12:
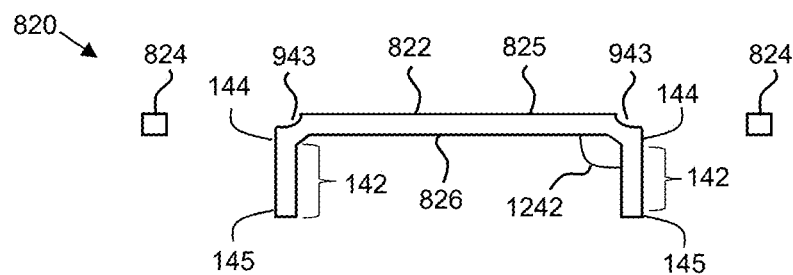
FIG. 12 is a side, cross-sectional view of the leadframe unit of FIG. 11 along line 12-12, in accordance with an example embodiment.

Referring now to FIGS. 7, 11, and 12, the method continues, in block 706, by converting the planar leadframe unit 810 into a non-planar leadframe unit 820. According to one or more embodiments, this conversion is accomplished by separating the distal ends 145 of the pre-bent leadframe terminals 142 from the sacrificial edge features 824, and then bending the leadframe terminals 142 at their proximal ends 144 (i.e., at the divots 943) toward a surface 826 of the sacrificial central feature 822 (referred to later as a "substrate-facing surface" 826) to form a non-planar leadframe unit 820. To illustrate, FIGS. 11 and 12 are, respectively, a top view and a side, cross-sectional view (along line 12-12) of a non-planar leadframe unit 820 after separating and bending the leadframe terminals 142 of the planar leadframe unit 810, in accordance with one or more embodiments.

Separating the distal ends 145 of the pre-bent leadframe terminals 142 may include sawing or laser cutting through the distal ends 145 of the leadframe terminals 145 where they connect to a sacrificial edge feature 824. A block (not shown) or other supportive structure may be placed under the sacrificial central feature 822, and then a force is applied to the upper surfaces of the pre-bent leadframe terminals 142 to bend them at their proximal ends 144 toward surface 826. The force is applied until each of the leadframe terminals 142 extends at about a 90 degree angle 1242 (i.e., perpendicularly) from the sacrificial central feature 822. During the bending process, the leadframe divots 943 may be bent open, as best shown in FIG. 12. After bending each of the leadframe terminals 142, each leadframe divot 943 extends between the upper surface 825 of the central sacrificial feature 822 and the proximal end 144 of the leadframe terminal 142.

Referring to FIG. 7 and block 708, the sacrificial corner features 823 and the sacrificial edge features 824 optionally may be removed in order to singulate each non-planar leadframe unit 820 from the panel (e.g., panel 800), or to otherwise prepare a non-planar leadframe unit 820 for assembly with a module substrate (e.g., module substrate 201, FIGS. 2, 4, 6, and 15). Alternatively, the sacrificial corner and edge features 823, 824 may be retained at this point so that a panel of connected non-planar leadframe units 820 may be coupled to a corresponding panel of module substrates.

Figure 13:
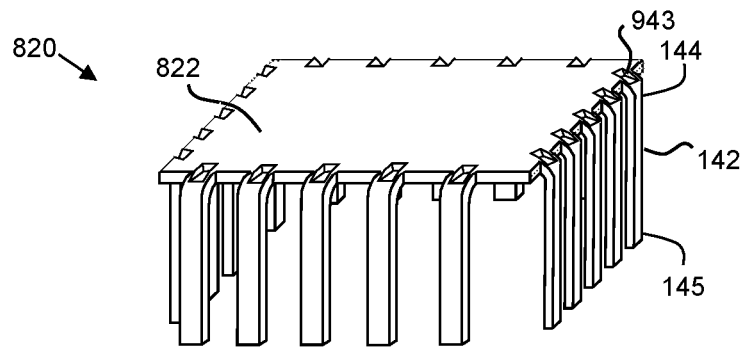
FIG. 13 is a perspective view of the leadframe unit of FIGS. 11 and 12, in accordance with an example embodiment.

FIG. 13 is a perspective view of a non-planar leadframe unit 820 of FIGS. 11 and 12, in accordance with an example embodiment. Essentially, at this stage, each non-planar leadframe unit 820 includes a sacrificial central feature 822, a plurality of leadframe divots 943 in an upper surface and at the edges of the sacrificial central feature 822, and a plurality of leadframe terminals 142 with proximal ends 144 coupled to the edges of the sacrificial central feature 822. The leadframe terminals 142 extend from their proximal ends 144 perpendicularly from the sacrificial central feature 822 in a direction opposite the leadframe divots 943. According to an embodiment, the distal ends 145 of the leadframe terminals 142 are distanced from the sacrificial central feature 822 by approximately the height 249 (FIG. 2) of the leadframe terminals 142. Desirably, the distal ends 145 are essentially coplanar, so that all of the distal ends 145 would contact a planar surface if the distal ends 145 of the non-planar leadframe unit 820 were placed on such a planar surface. That said, there may be slight variations in the distances of the distal ends 145 from the sacrificial central feature 822, which may be compensated for in later fabrication stages. At this point, the non-planar leadframe unit 820 is ready for assembly with a module substrate.

Figure 14:
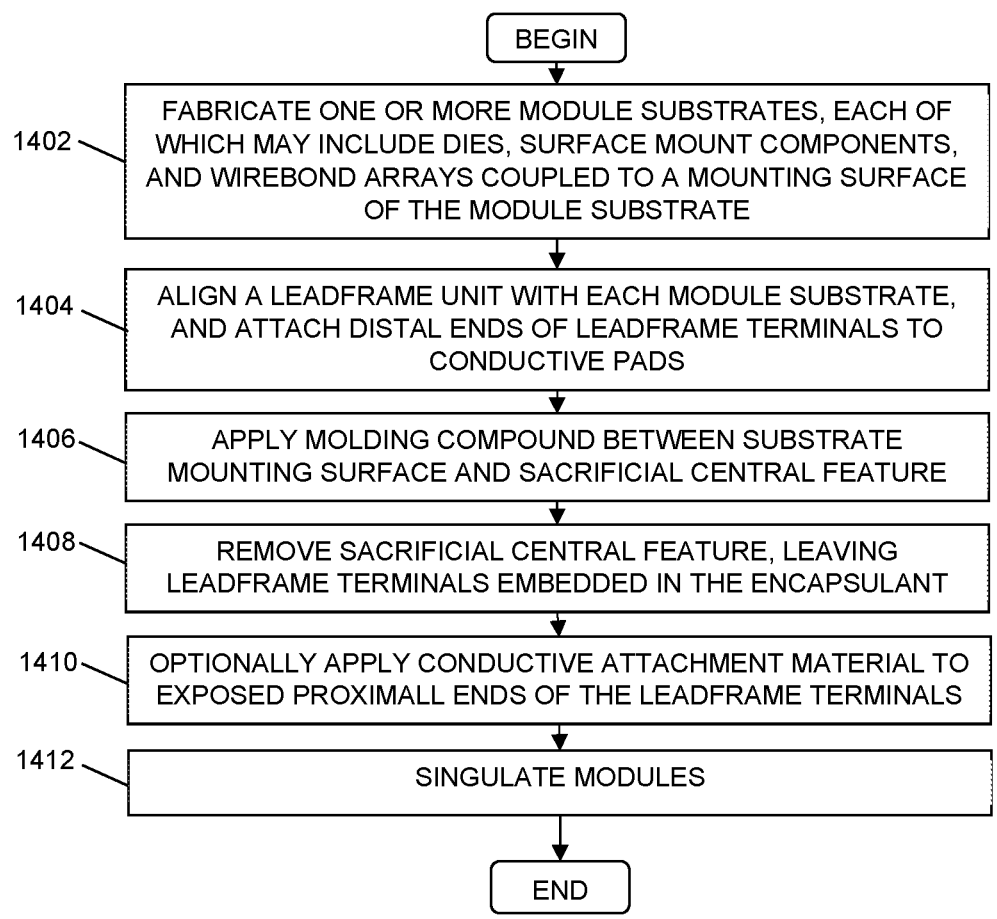
FIG. 14 is a flowchart of a method for fabricating a panel of circuit modules, each of which includes encapsulant-embedded leadframe terminals, according to an example embodiment.
Figure 15:
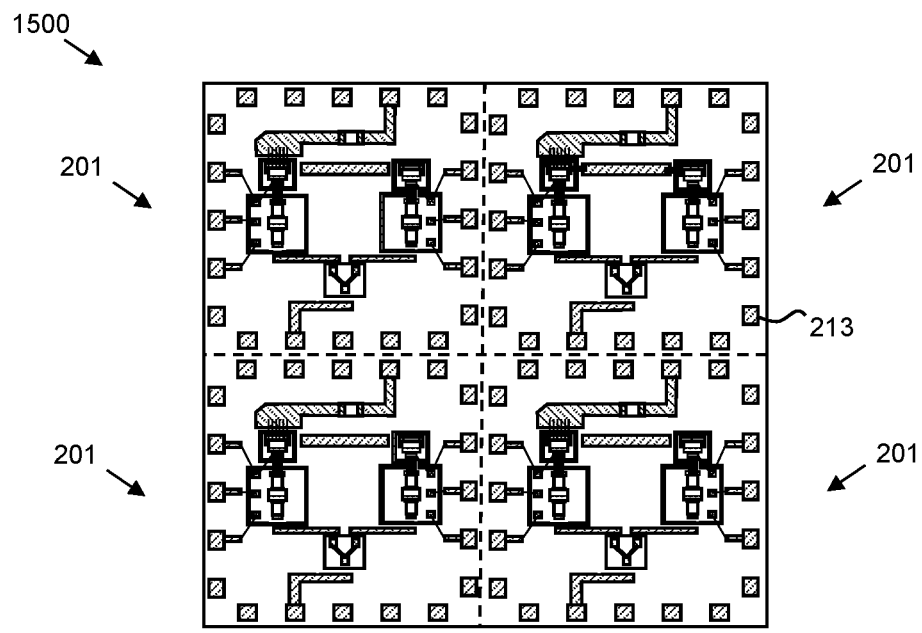
FIG. 15 is a top view of a panel of circuit modules at a first stage of manufacture, according to an example embodiment.
Figure 16:
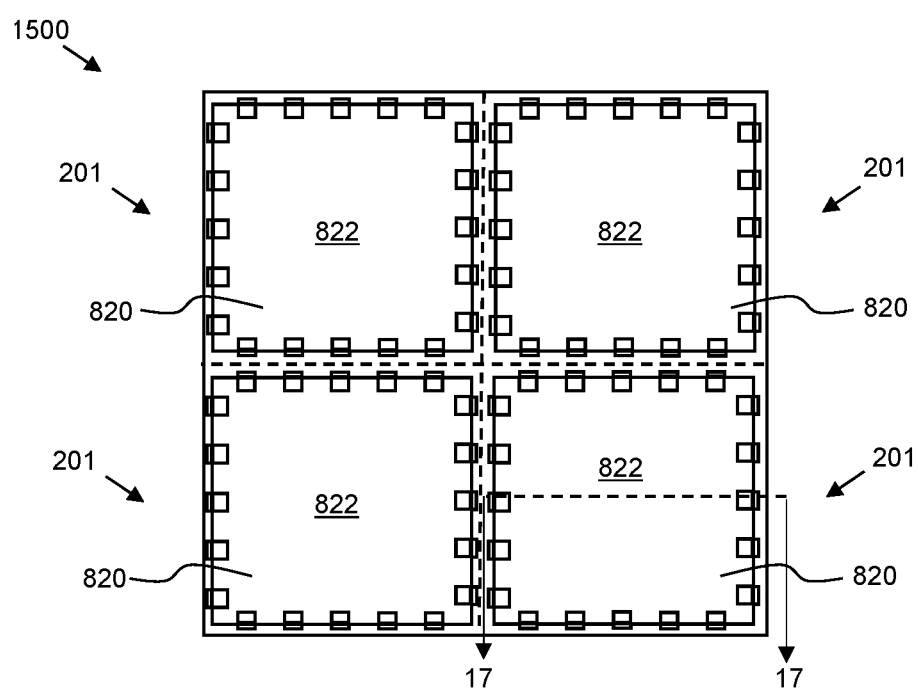
FIG. 16 is a top view of the panel of circuit modules of FIG. 15 at a second stage of manufacture, according to an example embodiment.

FIG. 14 is a flowchart of a method for fabricating one or more circuit modules (e.g., modules 100, FIG. 1), each of which includes encapsulant-embedded leadframe terminals 142, according to an example embodiment. For fabrication cost and efficiency, multiple identical circuit modules 100 may be created in parallel in the context of a module strip or module panel, and the multiple circuit modules 100 may be separated from each other during the fabrication process. Alternatively, a circuit module 100 may be formed individually. To indicate both fabrication processes, FIGS. 15 and 16 depict top views of a module panel 1500, which may be used to fabricate multiple circuit modules 100 in parallel, and FIGS. 17-20 each depict an individual circuit module 100 (or 100') during a series of fabrication steps. It should be understood that module panel 1500 (FIG. 15) may instead include only module substrate 1521, or that circuit modules 100, 100' depicted in FIGS. 17-20 could be fabricated in the context of a panel.

Referring both to FIGS. 14 and 15, the method begins, in block 1402, by providing a module panel 1500. For example, FIG. 15 is a top view of a module panel 1500 with four module substrates 201 (delineated with dashed lines), in accordance with one or more embodiments.

Each of the module substrates 201 may be the same as or substantially similar to the module substrates 201 described in conjunction with FIGS. 1-4 and 6, and the details described above with respect to module substrate 201 in conjunction with FIGS. 1-4 and 6 apply also to the module substrates 201 of FIGS. 15-20. Accordingly, those details are incorporated into this description of FIGS. 15-20. As a brief summary, each module substrate 201 has a first (or mounting) surface 202, a second (or bottom) surface 203, and a plurality of dielectric layers 214-216 and conductive layers 209-212 between the mounting and bottom surfaces 202, 203. In addition, each module substrate 201 includes a plurality of conductive features 213 at the mounting surface 202 proximate to the sides (e.g., sides 205, 207, FIG. 2) of the module substrate 201. As will be described later, the conductive features 213 are specifically designated for attachment of a leadframe unit 820, and more particularly for attachment of the distal ends 145 of a plurality leadframe terminals 142 of the leadframe unit 820. In some embodiments, each module substrate 201 also may include one or more thermal dissipation structures 218, which extend between the mounting and bottom surfaces 202, 203 of the module substrate 201.

According to an embodiment, at this stage of fabrication, circuitry already has been coupled to the mounting surface 202 of each module substrate 201. As described in conjunction with FIGS. 2, 4, and 6, the circuitry may include one or more semiconductor dies (e.g., dies 234, 254, 634, 654, FIGS. 2, 4, 6) coupled to the mounting surface 202 (e.g., coupled to a surface of a thermal dissipation structure 218 that is exposed at the mounting surface 202), one or more discrete components (e.g., splitter 224, FIGS. 2, 4, 6) coupled to the mounting surface 202, and various wirebond arrays interconnecting the dies, discrete components, and conductive traces (of patterned conductive layer 212). As discussed in conjunction with FIG. 6, the circuitry may embody a power amplifier (e.g., a Doherty power amplifier), although the circuitry may embody other types of circuits, as well.

Figure 17:
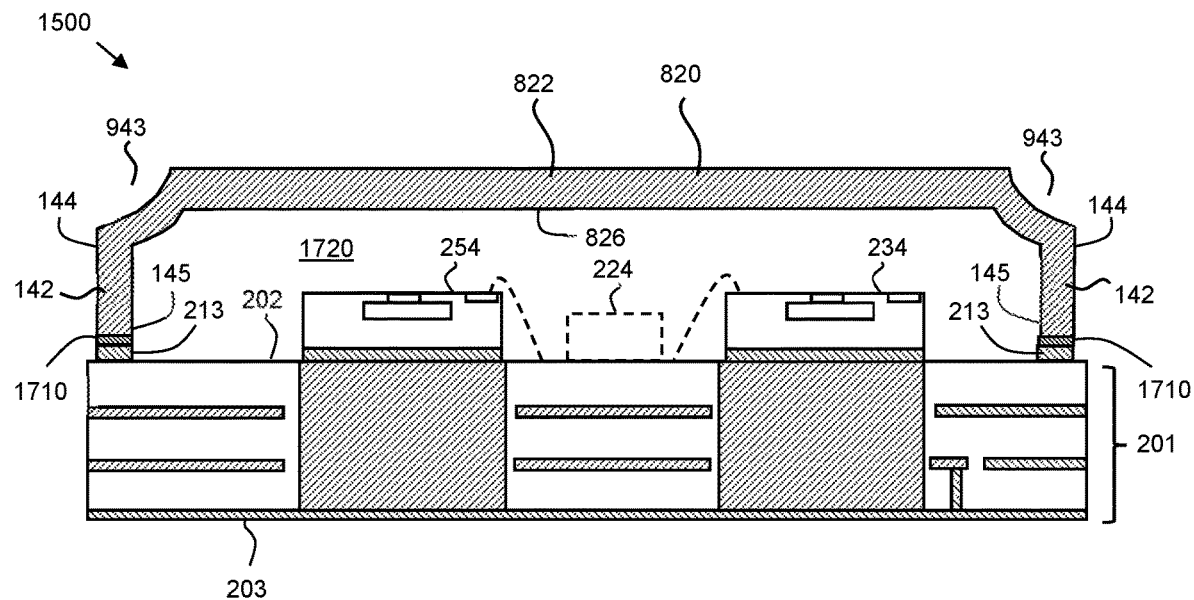
FIG. 17 is a side, cross-sectional view of a single, module unit of the panel of circuit modules of FIG. 16 along line 17-17, according to an example embodiment.

Referring now to FIGS. 14, 16, and 17, the method continues, in block 1404, by attaching a non-planar leadframe unit 820 to conductive features 213 at the mounting surface 202 of each module substrate 201. FIG. 16 is a top view of the panel 1500 of module substrates 201 at a subsequent stage of manufacture, and FIG. 17 is a cross-sectional view of a single module substrate 201 and a non-planar leadframe unit 820 along line 17-17 of FIG. 16. Referring to FIG. 17, in order to form the attachment, conductive attachment material 1710 (e.g., solder, solder paste, or conductive adhesive) may first be applied to each of the conductive features 213 of the module substrate 201 to which leadframe terminals 142 are to be coupled, and/or the conductive attachment material 1710 may be applied to the distal ends 145 of the leadframe terminals 145.

After applying the conductive attachment material 1710, a non-planar leadframe unit 820 is aligned with each module substrate 201. More particularly the distal ends 145 of the leadframe terminals 142 of a non-planar leadframe unit 820 are aligned with corresponding conductive features 213 of a module substrate 201. As indicated above, in some embodiments, the non-planar leadframe units 820 are separate from each other (e.g., sacrificial corner and edge features 823, 824 have been removed to produce individual leadframe units 820), while in other embodiments, a plurality of non-planar leadframe units 820 may still be coupled together through sacrificial features (e.g., sacrificial corner and edge features 823, 824 of a leadframe panel 800). Either way, once the non-planar leadframe units 820 are aligned with the module substrates 201, the conductive attachment material 1710 may be processed (e.g., reflowed) to secure the distal ends 145 of the leadframe terminals 142 to the conductive features 213. In an alternate embodiment, the conductive features 213 may include openings into which the distal ends 145 of the leadframe terminals 142 may be inserted. As most clearly shown in FIG. 17, attachment of the non-planar leadframe unit 820 to the module substrate 201 results in an air cavity 1720 between the mounting surface 202 of the module substrate 201 and a substrate-facing surface 826 of the sacrificial central feature 822 of the non-planar leadframe unit 820.

Figure 18:
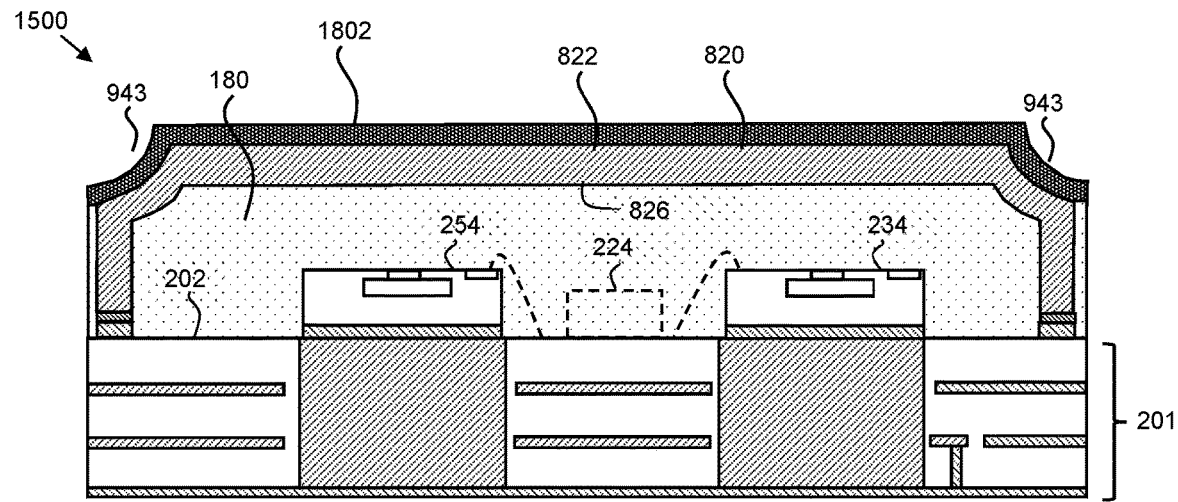
FIG. 18 is a side, cross-sectional view of the module unit of FIG. 17 at a third stage of manufacture, according to an example embodiment.

Referring now to FIGS. 14 and 18, the method continues, in block 1406, by applying encapsulant material 180 between the mounting surface 202 of the module substrate 201 and the substrate-facing surface 826 of the sacrificial central feature 822. FIG. 18 is a cross-sectional view of the module substrate 201 and non-planar leadframe unit 820 of FIG. 17 with applied encapsulant material 180.

For example, according to one or more embodiments, a film assisted molding (FAM) process may be performed in order to apply the encapsulant material 180. As shown in FIG. 18, the FAM process includes placing a film 1802 (e.g., a plastic film) over the non-planar leadframe unit 820 so that an adhesive side of the film 1802 contacts and protects the outward-facing surfaces of the leadframe unit 820, including the surfaces of the leadframe divots 942. The film 1802 is sucked down onto the outer surfaces of the non-planar leadframe unit 820. During the FAM process, the non-planar leadframe unit 820 functions to support the film 1802. Viscous encapsulant material 180 is then flowed into the air cavity 1720 between the mounting surface 202 of the module substrate 201 and the substrate-facing surface 826 of the non-planar leadframe unit 820. A sufficient quantity of encapsulant material 180 is applied in order to surround the leadframe terminals 142, to completely cover the mounting surface 202 and the various dies, components, and wire-bonds coupled to the mounting surface 202, and to extend up to and contact the substrate-facing surface 826 of the non-planar leadframe unit 820. Essentially, the encapsulant material 180 completely fills the air cavity 1720 between the mounting surface 202 and the non-planar leadframe unit 820. After curing the encapsulant material 180 and removing the film 1802, the result is an encapsulated circuit module (or a panel of encapsulated modules), as shown in FIG. 18.

Figure 19:
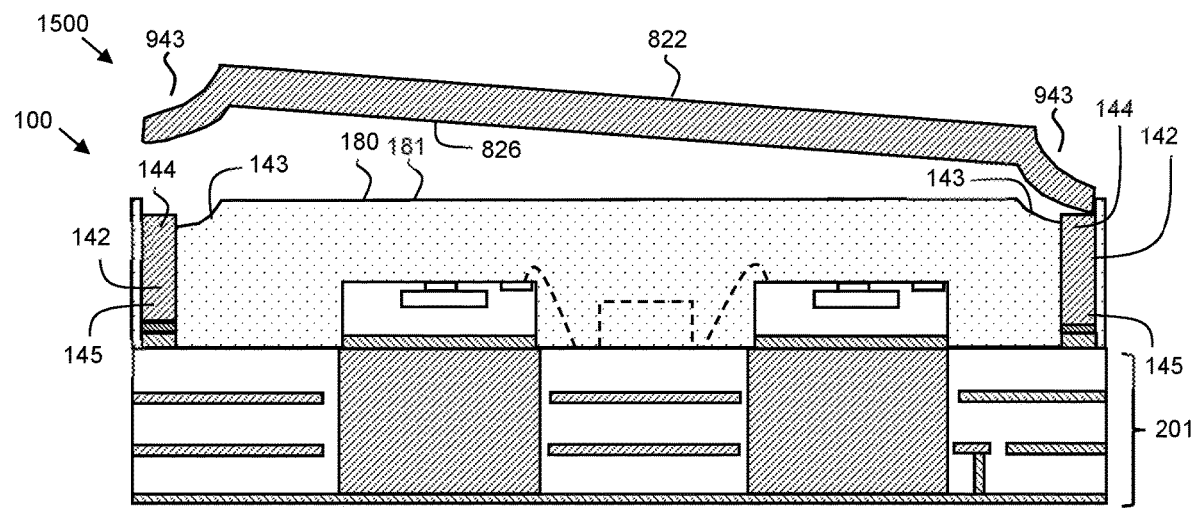
FIG. 19 is a side, cross-sectional view of the module unit of FIG. 18 at a fourth stage of manufacture, according to an example embodiment.

Referring now to FIGS. 14 and 19, the method continues, in block 1408, by removing the sacrificial central feature 822 of the non-planar leadframe unit 820, while leaving the leadframe terminals 142 embedded in the encapsulant material 180. FIG. 19 is a cross-sectional view of a circuit module 100 with the sacrificial central feature 822 partially removed.

According to one or more embodiments, the sacrificial central feature 822 may be removed by peeling the sacrificial central feature 822 off of the top surface 181 of the encapsulant material 180 (i.e., the surface 181 that was formed through contact of the encapsulant material 180 with the substrate-facing surface 826 of the sacrificial central feature 822). While peeling the sacrificial central feature 822 from the encapsulant material, the portions of the non-planar leadframe unit 820 corresponding to the leadframe divots 943 also may peel away, as shown in FIG. 19, and according to one or more embodiments. This results in separation of the leadframe divots 943 from the proximal ends 144 of the embedded leadframe terminals 142, and the formation of encapsulant divots 143 in the top surface 181 of the encapsulant material 180. As discussed previously in conjunction with FIG. 2, each of the encapsulant divots 143 are characterized by a width 245 (FIG. 2) and a depth 243 (FIG. 2) below surface 181.

During the peeling process, the proximal ends 144 of the embedded leadframe terminals 142 may snap off of the leadframe divots 943, and also may be pulled up some distance into the encapsulant divots 143. Either way, the proximal ends 144 of the leadframe terminals 142 are exposed in the encapsulant divots 143, and the distal ends 145 of the leadframe terminals 142 remain embedded in the encapsulant material 180 and attached to the conductive features 213.

Figure 20:
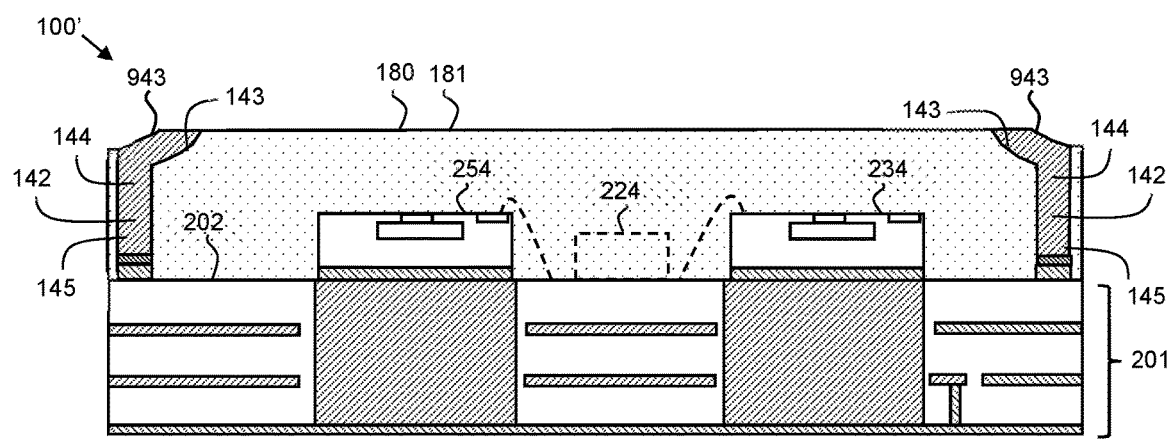
FIG. 20 is a side, cross-sectional view of the module unit of FIG. 18 at a fourth stage of manufacture, according to an alternate example embodiment.

Referring now to FIG. 20, according to an alternate embodiment, rather than peeling the sacrificial central feature 822 and leadframe divots 943 from the device 100, a grinding and/or polishing process may be performed to remove the sacrificial central feature 822 without removing all of the material of the leadframe divots 943. In such an embodiment, the resulting circuit device 100' includes at least portions of the leadframe divots 943 (or conductive "cups") remaining attached to the proximal ends 144 of the leadframe terminals 142, and nested within the encapsulant divots 143. The leadframe terminals 142 and the leadframe divots 943 are integrally formed from the same leadframe unit 820. The leadframe divots 943 remain unfilled with encapsulant material 180. Regardless of whether the leadframe divots 943 are removed (as in the embodiment illustrated in FIG. 19) or portions of the leadframe divots 943 are retained (as in the embodiment illustrated in FIG. 20), the proximal ends 144 of each of the leadframe interconnects 142 terminates at one of the plurality of encapsulant divots 143.

Referring now to FIGS. 3, 4, and 14 and block 1410, conductive attachment material 342 (e.g., solder, solder paste, or conductive adhesive) may then be applied to the exposed distal ends 145 of the leadframe terminals 142 to prepare the circuit module 100 (or 100') for integration into a larger electrical system. According to some embodiments, the conductive attachment material 342 essentially nests into the encapsulant divots 143 in device module 100 (or into the leadframe divots 943 in device module 100').

Referring again to FIG. 14 and block 1412, if a plurality of circuit modules 100 were fabricated in parallel using a module panel (e.g., panel 1500, FIG. 15), a singulation process may be performed to produce a plurality of individual circuit modules 100. At this point, fabrication of the circuit module 100 (or 100') is complete.

Figure 21:
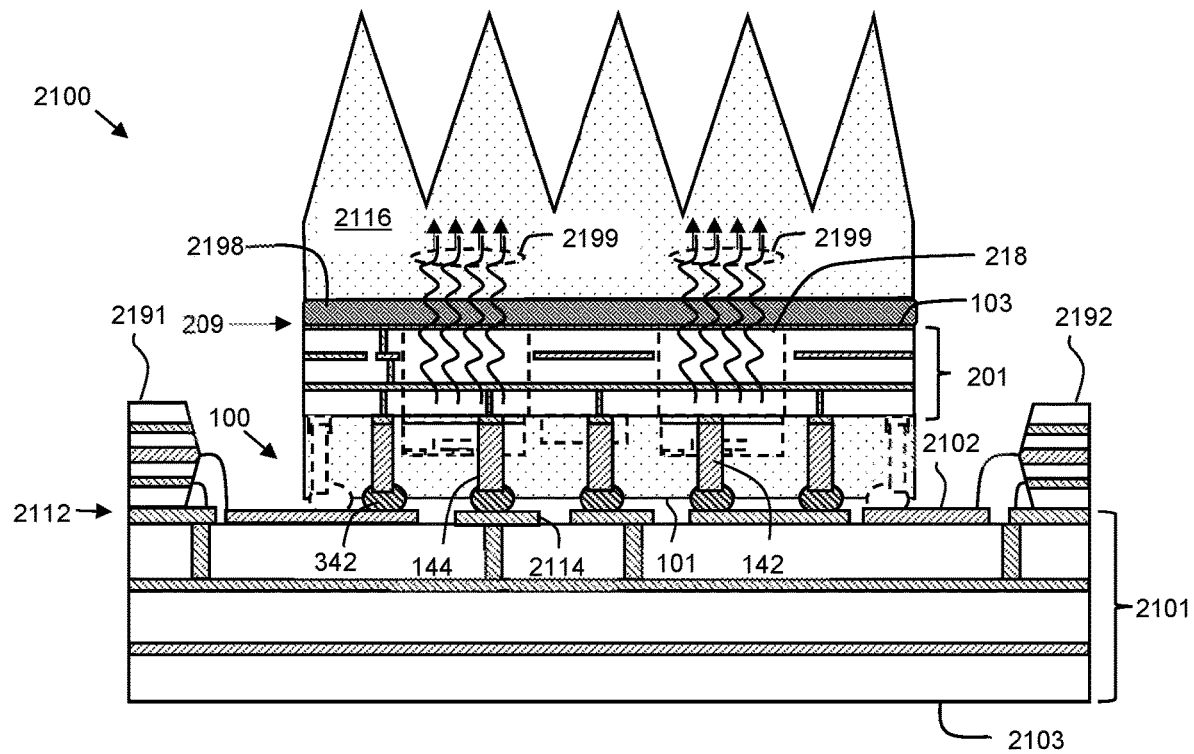
FIG. 21 is a side, cross-sectional view of a circuit module with encapsulant-embedded leadframe terminals incorporated into a top-side cooled electronic system, according to an example embodiment.

As mentioned above, the circuit module 100 may be integrated into a larger electronic system. In some cases, the circuit module 100 may be attached to a system substrate in a flip-chip or inverted orientation, which may be beneficial in that it enables a "top side cooled" system configuration. For example, FIG. 21 is a side, cross-sectional view of a circuit module 100 incorporated into a top-side cooled electronic system 2100, according to an example embodiment. More specifically, the top-side cooled electronic system 2100 includes a system substrate 2101, an embodiment of a circuit module 100 (or 100'), and a heat sink 2116. The system substrate 2101 includes a multi-layer printed circuit board (PCB) or other suitable substrate.

The system substrate 2101 has a top surface 2102 (also referred to as a "mounting surface") and an opposed bottom surface 2103. As depicted in FIG. 21, the system substrate 2101 includes a plurality of dielectric layers (e.g., formed from FR-4, ceramic, or other PCB dielectric materials) in an alternating arrangement with a plurality of conductive layers. The mounting surface 2102 of the system substrate 2101 may include a patterned conductive layer 2112, which may primarily function as a signal conducting layer. More specifically, the patterned conductive layer 2112 includes a plurality of conductive features (e.g., conductive pads and traces) which serve as attachment points for module 100, an input connector 2191, and an output connector 2192. Each of connectors 2191, 2192 may, for example, be coaxial connectors with a central signal conductor and an outer ground shield. According to an embodiment, the signal conductor of input connector 2191 is electrically coupled to a first conductive trace of layer 2112, which in turn is coupled to an input terminal (e.g., terminal 620, FIG. 6) of the circuit module 100. In addition, the signal conductor of output connector 2192 is electrically coupled to a second conductive trace of layer 2112, which in turn is coupled to an output terminal (e.g., terminal 622, FIG. 6) of the circuit module 100. The ground shields of connectors 2191, 2192 are electrically coupled to additional traces (not numbered), which in turn are electrically coupled to a system ground layer (not numbered) of the system substrate 2101 through conductive vias.

Circuit module 100 (or 100') is coupled to the mounting surface 2102 of system substrate 2101 in an inverted (or "flipped") orientation from the orientations depicted in FIGS. 2, 4, 20, and 21. More specifically, circuit module 100 is coupled to the system substrate 2101 so that the first surface 101 of the module 100 and the mounting surface 2102 of the system substrate 2101 face each other. In order to connect module 100 to system substrate 2101, each of the proximal ends 144 of the terminals 142 of module 100 are aligned with corresponding pads (e.g., pad 2114) on the mounting surface 2102 of system substrate 2101. In embodiments in which conductive attachment material 342 is disposed on the exposed ends of the module terminals 142, the conductive attachment material 342 is reflowed or otherwise cured to physically connect the module terminals to their corresponding pads on the mounting surface 2102 of the module substrate 2101. In other embodiments, conductive attachment material also or alternatively may be disposed on the conductive pads (e.g., pad 2114) of the system substrate 2101, and an appropriate reflow or curing process may be performed to connect the module 100 to the system substrate 2101.

According to an embodiment, a heat sink 2116 is physically and thermally coupled to the second surface 103 of the circuit module 100, and more specifically to conductive layer 209 and/or the surface(s) of the embedded heat dissipation structure(s) 218 of module 100. The heat sink 2116 is formed from a thermally-conductive material, which also may be electrically-conductive. For example, the heat sink 2116 may be formed from copper or another bulk conductive material. To couple the heat sink 2116 to the circuit module 100, a thermally conductive material 2198 (e.g., thermal grease) may be dispensed on the head sink 2116 and/or on the second surface 103 of the module 100 (and/or on the surface(s) of the heat dissipation structure(s) 218). The heat sink 2116 is then brought into contact with the second surface 103. The heat sink 2116 may then be clamped, screwed, or otherwise secured in place.

During operation of system 2100, input signals are provided through the input terminal 2191, and the input signals are conveyed through the system substrate 2101 to the input terminal (e.g., terminal 620, FIG. 6) of the circuit module 100. The circuitry within the circuit module 100 processes (e.g., amplifies) the input signal, and produces an output signal at the output terminal (e.g., terminal 622, FIG. 6). During operation, significant thermal energy (heat) may be produced by the components (e.g., power transistor dies 234, 254, 634, 654, FIGS. 2, 4, 6). As indicated by arrows 2199, the thermal energy produced by the components is conveyed through the thermal dissipation structures 218 to the heat sink 2116, which effectively dissipates the heat to the ambient atmosphere.

Figure 22:
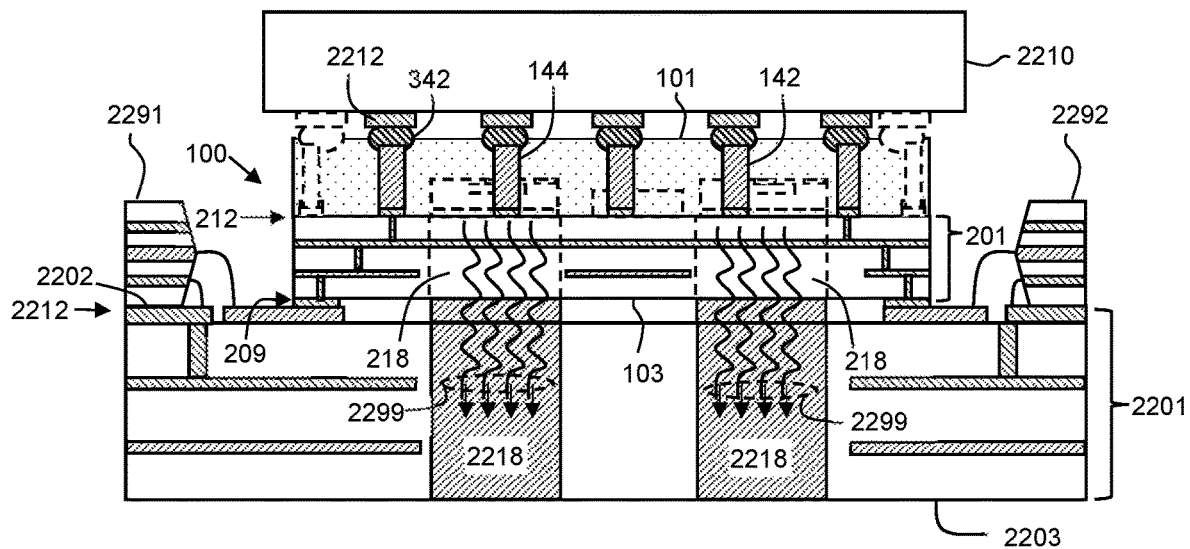
FIG. 22 is a side, cross-sectional view of a circuit module with encapsulant-embedded leadframe terminals incorporated into a package-on-package electronic system, according to an example embodiment.

As also mentioned above, an embodiment of a circuit module 100 (or 100') alternatively may be coupled to a system substrate in a non-inverted orientation, and the circuit module 100 may serve as a "bottom device" or "lower device" in a "package-on-package" electronic system. For example, FIG. 22 is a side, cross-sectional view of a circuit module 100 incorporated into a package-on-package electronic system 2200, according to an example embodiment. More specifically, the package-on-package electronic system 2200 includes a system substrate 2201, an embodiment of a circuit module 100 (or 100'), and an upper electronic device 2210. It should be noted here that, in the embodiment of the circuit module 100 shown in FIG. 22, the conductive layer 209 at the second surface 103 of circuit module 100 may be patterned so that a first patterned conductor may be used as an input terminal for the circuit module 100, and a second patterned conductor may be used as an output terminal for the circuit module 100.

The system substrate 2201 has a top surface 2202 (also referred to as a "mounting surface") and an opposed bottom surface 2203. As depicted in FIG. 22, the system substrate 2201 includes a plurality of dielectric layers (e.g., formed from FR-4, ceramic, or other PCB dielectric materials) in an alternating arrangement with a plurality of conductive layers. The mounting surface 2202 of the system substrate 2201 may include a patterned conductive layer 2212, which may primarily function as a signal conducting layer. More specifically, the patterned conductive layer 2212 includes a plurality of conductive features (e.g., conductive pads and traces) which serve as attachment points for module 100, an input connector 2291, and an output connector 2292. Each of connectors 2291, 2292 may, for example, be coaxial connectors with a central signal conductor and an outer ground shield. According to an embodiment, the signal conductor of input connector 2291 is electrically coupled to a first conductive trace of layer 2212, which in turn is coupled to an input terminal of the circuit module 100. In addition, the signal conductor of output connector 2292 is electrically coupled to a second conductive trace of layer 2212, which in turn is coupled to an output terminal of the circuit module 100. The ground shields of connectors 2291, 2292 are electrically coupled to additional traces (not numbered), which in turn are electrically coupled to a system ground layer (not numbered) of the system substrate 2201 through conductive vias. According to one or more embodiments, the system substrate 2201 also may include thermal coins 2218 or thermal vias that extend between the top and bottom surfaces 2202, 2203 of the system substrate 2201.

Circuit module 100 (or 100') is coupled to the mounting surface 2202 of system substrate 2201 in a non-inverted orientation (i.e., the same orientations depicted in FIGS. 2, 4, and 20). More specifically, circuit module 100 is coupled to the system substrate 2201 so that the second surface 103 of the module 100 and the mounting surface 2202 of the system substrate 2201 face each other. In order to connect module 100 to system substrate 2201, patterned conductors formed from portions of conductive layer 209 of circuit module 100 are aligned with corresponding conductive pads formed from patterned conductive layer 2212 of the system substrate 2201, and the corresponding conductors and pads are connected using a conductive attachment material (e.g., solder, solder paste, conductive adhesive).

To form a package-on-package configuration, the upper electronic device 2210 is then coupled to the first surface 101 of module 100. In order to connect the upper electronic device 2210 to module 100, conductive pads on the substrate-facing surface of the upper electronic device 2210 are aligned with corresponding proximal ends 144 of the terminals 142 of module 100. In embodiments in which conductive attachment material 342 is disposed on the exposed ends of the module terminals 142, the conductive attachment material 342 is reflowed or otherwise cured to physically connect the module terminals to their corresponding pads on the upper electronic device 2210. In other embodiments, conductive attachment material also or alternatively may be disposed on the conductive pads of the upper electronic device 2210, and an appropriate reflow or curing process may be performed to connect the upper electronic device 2210 to the module 100.

During operation of system 2200, input signals are provided through the input terminal 2291, and the input signals are conveyed through the system substrate 2201 to the input terminal (e.g., terminal 620, FIG. 6) of the circuit module 100. The circuitry within the circuit module 100 processes (e.g., amplifies) the input signal, and produces an output signal at the output terminal (e.g., terminal 622, FIG. 6). Additional signals may be conveyed between the circuit module 100 and the upper electronic device 2210 through the leadframe terminals 142.

During operation, significant thermal energy (heat) may be produced by the components (e.g., power transistor dies 234, 254, 634, 654, FIGS. 2, 4, 6). As indicated by arrows 2299, the thermal energy produced by the components is conveyed through the thermal dissipation structures 218 of the circuit module 100 to the thermal coins 2218 of the system substrate 2201, which convey the thermal energy to the bottom surface 2203 of the system substrate 2201.

Embodiments of a circuit module include a module substrate with a mounting surface, a plurality of conductive features at the mounting surface, and electronic circuitry coupled to the mounting surface of the module substrate. Encapsulant material covers the electronic circuitry and the mounting surface of the module substrate, and an upper surface of the encapsulant material defines a first surface of the circuit module. A plurality of leadframe terminals extend from the conductive features at the mounting surface through the encapsulant material toward the first surface of the circuit module. Each of the leadframe terminals is formed from an elongated planar conductive feature of a leadframe unit, and the plurality of leadframe terminals is electrically coupled to the electronic circuitry through the conductive features and the module substrate. According to some further embodiments, encapsulant divots extend into the encapsulant material from the first surface of the circuit module, and proximal ends of the leadframe terminals terminate at the encapsulant divots.

Embodiments of an electronic system include a system substrate with a top surface and a plurality of conductive pads at the top surface, and a circuit module coupled to the conductive pads of the system substrate. The circuit module includes a module substrate with a mounting surface, a bottom surface, and a plurality of conductive features at the mounting surface. The bottom surface of the module substrate defines a bottom surface of the circuit module. Electronic circuitry is coupled to the mounting surface of the module substrate. Encapsulant material covers the electronic circuitry and the mounting surface of the module substrate, and an upper surface of the encapsulant material defines a top surface of the circuit module. A plurality of leadframe terminals extend from the conductive features at the mounting surface through the encapsulant material toward the top surface of the circuit module. Each of the leadframe terminals is formed from an elongated planar conductive feature of a leadframe unit, and the plurality of leadframe terminals is electrically coupled to the electronic circuitry through the conductive features.

Embodiments of a method of fabricating a circuit module include providing a non-planar leadframe unit that includes a sacrificial central feature and a plurality of leadframe terminals, where a proximal end of each of the plurality of leadframe terminals is coupled to the sacrificial central feature, and each of the plurality of leadframe terminals extends at a right angle from a substrate-facing surface of the sacrificial central feature. The method further includes coupling electronic circuitry to a mounting surface of a module substrate, and electrically coupling distal ends of the plurality of leadframe terminals to a plurality of conductive features at the mounting surface of the module substrate. The plurality of leadframe terminals is electrically coupled to the electronic circuitry through the conductive features and the module substrate. The method further includes applying encapsulant material between the module substrate and the substrate-facing surface of the sacrificial central feature. The encapsulant material covers the electronic circuitry and the mounting surface of the module substrate, the encapsulant material extends from the mounting surface of the module substrate to the substrate-facing surface of the leadframe unit, and the encapsulant material surrounds the plurality of leadframe terminals. The method further includes removing the sacrificial central feature from a top surface of the encapsulant material without removing the leadframe terminals from the encapsulant material. The top surface of the encapsulant material defines a first surface of the circuit module.

According to a further embodiment, providing the non-planar leadframe unit includes providing a planar leadframe unit that includes the sacrificial central feature and a plurality of pre-bent leadframe terminals connected to the sacrificial central feature, and bending each of the pre-bent leadframe terminals toward the substrate-facing surface of the sacrificial central feature to form the plurality of leadframe terminals that extend at the right angle from the substrate-facing surface of the sacrificial central feature.

According to another further embodiment, before bending each of the pre-bent leadframe terminals, a plurality of leadframe divots is formed in an upper surface of the sacrificial central feature, and after bending each of the leadframe terminals, each leadframe divot of the plurality of leadframe divots extends between the upper surface of the central sacrificial feature and the proximal end of the leadframe terminal.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A circuit module comprising:
a module substrate with a mounting surface and a plurality of conductive features at the mounting surface;
electronic circuitry coupled to the mounting surface of the module substrate; encapsulant material covering the electronic circuitry and the mounting surface of the module substrate, wherein an upper surface of the encapsulant material defines a first surface of the circuit module, and wherein encapsulant divots extend into the encapsulant material from the first surface, and surfaces of the encapsulant divots are defined by the encapsulant material;
a plurality of leadframe terminals extending from the conductive features at the mounting surface through the encapsulant material toward the first surface of the circuit module, wherein each of the leadframe terminals is formed from an elongated planar conductive feature of a leadframe unit, wherein the plurality of leadframe terminals is electrically coupled to the electronic circuitry through the conductive features and the module substrate, and wherein proximal ends of the leadframe terminals terminate at and are exposed in the encapsulant divots; and conductive attachment material coupled to the proximal ends of the leadframe terminals within the encapsulant divots.

2. The circuit module of claim 1, wherein each of the leadframe terminals has a rectangular cross section.

3. The circuit module of claim 1, wherein each of the leadframe terminals is formed from one or more materials selected from copper and a copper alloy.

4. The circuit module of claim 1, wherein:
surfaces of the encapsulant divots are defined by the encapsulant material; and
the circuit module further includes leadframe divots nested within the encapsulant divots, wherein the leadframe divots are integrally formed with the leadframe terminals.

5. The circuit module of claim 4, wherein the leadframe divots are unfilled with the encapsulant material.

6. The circuit module of claim 1, wherein:
the encapsulant divots each have a lowest extent at a depth of at least 0.100 millimeters below the first surface of the circuit module.

7. The circuit module of claim 1, wherein:
the leadframe terminals are embedded within the encapsulant material proximate to sides of the encapsulant material; and
the encapsulant material surrounds each of the leadframe terminals.

8. The circuit module of claim 1, wherein:
the module substrate further includes a thermal dissipation structure that extends through the module substrate;
the thermal dissipation structure has a first surface that is exposed at the mounting surface of the module substrate; and
the electronic circuitry includes an integrated circuit die connected to the first surface of the thermal dissipation structure.

9. The circuit module of claim 8, wherein:
the thermal dissipation structure includes a structure selected from a conductive coin, and a set of thermal vias.

10. The circuit module of claim 9, wherein:
the integrated circuit die is a power amplifier die, and the thermal dissipation structure is configured to provide a thermal path for heat produced by the power amplifier die during operation of the circuit module.

11. An electronic system comprising:
a system substrate with a top surface and a plurality of conductive pads at the top surface;
a circuit module coupled to the conductive pads of the system substrate, wherein the circuit module includes
a module substrate with a mounting surface, a bottom surface, and a plurality of conductive features at the mounting surface, wherein the bottom surface of the module substrate defines a bottom surface of the circuit module,
electronic circuitry coupled to the mounting surface of the module substrate,
encapsulant material covering the electronic circuitry and the mounting surface of the module substrate, wherein an upper surface of the encapsulant material defines a top surface of the circuit module, and wherein encapsulant divots extend into the encapsulant material from the top surface, and surfaces of the encapsulant divots are defined by the encapsulant material, and
a plurality of leadframe terminals extending from the conductive features at the mounting surface through the encapsulant material toward the top surface of the circuit module, wherein each of the leadframe terminals is formed from an elongated planar conductive feature of a leadframe unit, wherein the plurality of leadframe terminals is electrically coupled to the electronic circuitry through the conductive features, and wherein proximal ends of the leadframe terminals terminate at and are exposed in the encapsulant divots; and
conductive attachment material within the encapsulant divots that physically and electrically couples the proximal ends of the leadframe terminals at the top surface of the circuit module to the conductive pads at the top surface of the system substrate.

12. The electronic system of claim 11, wherein:
the module substrate further includes a thermal dissipation structure that extends between the mounting surface and the bottom surface of the module substrate;
the electronic circuitry includes an integrated circuit die connected to a surface of the thermal dissipation structure that is exposed at the mounting surface of the module substrate; and
the electronic system further includes a heat sink coupled to the thermal dissipation structure at the bottom surface of the module substrate.

13. The electronic system of claim 11, wherein:
the electronic system further includes another electronic device; and
the proximal ends of the leadframe terminals at the top surface of the circuit module are coupled to the another electronic device through the conductive attachment material within the encapsulant divots.

14. A method of fabricating a circuit module, the method comprising:
coupling electronic circuitry to a mounting surface of a module substrate;
providing a non-planar leadframe unit that includes a sacrificial central feature and a plurality of leadframe terminals, wherein proximal end of each ends of the plurality of leadframe terminals are coupled to the sacrificial central feature, wherein each of the plurality of leadframe terminals extends at a right angle from a substrate-facing surface of the sacrificial central feature, and wherein the non-planar leadframe unit further includes a plurality of leadframe divots in an upper surface of the central sacrificial feature at the proximal ends of the leadframe terminals;
electrically coupling distal ends of the plurality of leadframe terminals to a plurality of conductive features at the mounting surface of the module substrate, wherein the plurality of leadframe terminals is electrically coupled to the electronic circuitry through the conductive features and the module substrate;
applying encapsulant material between the module substrate and the substrate-facing surface of the sacrificial central feature, wherein the encapsulant material covers the electronic circuitry and the mounting surface of the module substrate, the encapsulant material extends from the mounting surface of the module substrate to the substrate-facing surface of the leadframe unit, and the encapsulant material surrounds the plurality of leadframe terminals;
removing the sacrificial central feature, including removing the plurality of leadframe divots, from a top surface of the encapsulant material without removing the leadframe terminals from the encapsulant material, wherein the top surface of the encapsulant material defines a first surface of the circuit module, wherein removing the plurality of leadframe divots results in formation of a plurality of encapsulant divots that are defined by and extend into the encapsulant material from the first surface, wherein after removing the plurality of leadframe divots, the proximal ends of the plurality of leadframe terminals are exposed within and terminate at the plurality of encapsulant divots; and
applying conductive attachment material to the proximal ends of the plurality of leadframe terminals within the plurality of encapsulant divots.

15. The method of claim 14, wherein providing the non-planar leadframe unit comprises:
providing a planar leadframe unit that includes the sacrificial central feature and a plurality of pre-bent leadframe terminals connected to the sacrificial central feature; and
bending each of the pre-bent leadframe terminals toward the substrate-facing surface of the sacrificial central feature to form the plurality of leadframe terminals that extend at the right angle from the substrate-facing surface of the sacrificial central feature.

16. The method of claim 15, further comprising:
before bending each of the pre-bent leadframe terminals, forming the plurality of leadframe divots in the upper surface of the sacrificial central feature, wherein, after bending each of the leadframe terminals, each leadframe divot of the plurality of leadframe divots extends between the upper surface of the central sacrificial feature and the proximal end of the leadframe terminal.

* * * * *